United States Patent
Bilinsky et al.

(10) Patent No.: US 12,504,642 B2
(45) Date of Patent: Dec. 23, 2025

(54) SYSTEMS AND METHODS FOR FABRICATING MICROSTRUCTURES

(71) Applicant: MICROTAU IP PTY LTD, Sydney (AU)

(72) Inventors: Henry Claudius Bilinsky, Sydney (AU); Joseph Builth-Williams, Sydney (AU); John Whitelock-Jones, Sydney (AU); Mitchell Quinn, Camperdown (AU)

(73) Assignee: MicroTau IP Pty Lted, Sydney (AU)

( * ) Notice: Subject to any disclaimer, the term of this patent is extended or adjusted under 35 U.S.C. 154(b) by 968 days.

(21) Appl. No.: 17/614,324

(22) PCT Filed: May 29, 2020

(86) PCT No.: PCT/AU2020/050543
§ 371 (c)(1),
(2) Date: Nov. 24, 2021

(87) PCT Pub. No.: WO2020/237317
PCT Pub. Date: Dec. 3, 2020

(65) Prior Publication Data
US 2022/0221732 A1 Jul. 14, 2022

(30) Foreign Application Priority Data
May 30, 2019 (AU) ................ 2019901869

(51) Int. Cl.
*G02B 27/42* (2006.01)
*G02B 5/18* (2006.01)
*G03F 7/00* (2006.01)

(52) U.S. Cl.
CPC ......... *G02B 27/425* (2013.01); *G02B 5/1842* (2013.01); *G03F 7/70025* (2013.01); *G03F 7/70158* (2013.01)

(58) Field of Classification Search
CPC ............. G03F 7/70158; G03F 7/70025; G03F 7/70408; G02B 5/1842; G02B 27/425; B29D 11/00769
See application file for complete search history.

(56) References Cited

U.S. PATENT DOCUMENTS

| 4,402,571 A | 9/1983 | Cowan et al. |
|---|---|---|
| 6,345,791 B1 | 2/2002 | Mcclure |

(Continued)

FOREIGN PATENT DOCUMENTS

| DE | 102007021249 A1 | 11/2008 |
|---|---|---|
| JP | 2006-339359 A | 12/2006 |

(Continued)

OTHER PUBLICATIONS

Chausse et al., Understanding resolution limit of displacement Talbot lithography (2019), Optics Express (Year: 2019).*

(Continued)

*Primary Examiner* — Ephrem Z Mebrahtu
(74) *Attorney, Agent, or Firm* — Cognition IP, P.C.; Edward Steakley

(57) ABSTRACT

Methods for forming microstructures in photocurable material are described. At least one image of light or radiation for curing the photocurable material is applied in a pattern corresponding to the image. The image is formed by near-field diffraction of the light or radiation and comprises areas of higher intensity adjacent to areas of lower intensity.

20 Claims, 18 Drawing Sheets

(56) References Cited

U.S. PATENT DOCUMENTS

| | | | |
|---|---|---|---|
| 8,124,193 | B2 | 2/2012 | Belelie et al. |
| 8,236,480 | B2 | 8/2012 | Locascio et al. |
| 8,367,306 | B1 | 2/2013 | Doty et al. |
| 8,368,871 | B2 | 2/2013 | Solak et al. |
| 8,524,443 | B2 | 9/2013 | Clube et al. |
| 8,525,973 | B2 | 9/2013 | Solak et al. |
| 8,617,775 | B2 | 12/2013 | Solak et al. |
| 8,841,046 | B2 | 9/2014 | Solak et al. |
| 8,904,316 | B2 | 12/2014 | Solak et al. |
| 9,007,566 | B2 | 4/2015 | Clube et al. |
| 9,036,133 | B2 | 5/2015 | Solak et al. |
| 9,182,672 | B2 | 11/2015 | Solak et al. |
| 9,280,056 | B2 | 3/2016 | Clube et al. |
| 9,658,535 | B2 | 5/2017 | Clube et al. |
| 2005/0057735 | A1* | 3/2005 | Smith ................ G03F 7/70408 355/53 |
| 2011/0199598 | A1* | 8/2011 | Solak ................... G03F 7/7035 355/77 |
| 2013/0323651 | A1* | 12/2013 | Solak ..................... G03F 7/201 355/53 |
| 2013/0344445 | A1* | 12/2013 | Clube .................... G03B 27/54 355/71 |
| 2014/0307242 | A1 | 10/2014 | Solak et al. |
| 2015/0248060 | A1 | 9/2015 | Amano |
| 2016/0062246 | A1* | 3/2016 | Clube ................ G03F 7/70408 355/67 |
| 2016/0265125 | A1* | 9/2016 | Yokoyama ............... C25D 5/48 |
| 2017/0324209 | A1* | 11/2017 | Shohda ................. H01S 3/0632 |
| 2020/0264518 | A1* | 8/2020 | Chadha ................ G02B 5/1866 |
| 2022/0155691 | A1* | 5/2022 | Clube .................. G02B 5/1857 |

FOREIGN PATENT DOCUMENTS

| | | | | |
|---|---|---|---|---|
| JP | 2007-264224 | A | 10/2007 | |
| WO | WO-9812603 | A1 * | 3/1998 | .......... G03F 7/7035 |
| WO | 2002/077710 | A2 | 10/2002 | |
| WO | 2005/121897 | A1 | 12/2005 | |
| WO | 2006/045439 | A2 | 5/2006 | |
| WO | 2008/135320 | A2 | 11/2008 | |
| WO | 2009/129858 | A1 | 10/2009 | |
| WO | 2011/057835 | A1 | 5/2011 | |
| WO | 2012/049638 | A1 | 4/2012 | |
| WO | 2012/066489 | A2 | 5/2012 | |
| WO | 2012/164539 | A1 | 12/2012 | |
| WO | WO-2013029985 | A2 * | 3/2013 | ............... G03F 1/50 |
| WO | 2016/103132 | A1 | 6/2016 | |
| WO | 2016/115640 | A1 | 7/2016 | |
| WO | 2017/063040 | A1 | 4/2017 | |

OTHER PUBLICATIONS

Notice of Reasons for Rejection in Japanese Patent Application No. 2018-518969, dated Jul. 28, 2020.

Alvankarian et al., "Exploiting the Oxygen Inhibitory Effect on UV Curing in Microfabrication: A Modified Lithography Technique", Plos One, vol. 10, No. 3, Mar. 6, 2015, pp. 1-12.

Extended European Search Report received for European Patent Application No. 16854644.8, mailed on Jun. 3, 2019, 9 pages.

International Preliminary Report on Patentability received for PCT Patent Application No. PCT/AU2016/050960, completed on Feb. 1, 2018, 6 pages.

International Search Report and Written Opinion received for PCT Patent Application No. PCT/AU2016/050960, mailed on Dec. 5, 2016, 11 pages.

Solak et al., "Achromatic Spatial Frequency Multiplication: A Method for Production of Nanometer-Scale Periodic Structures", Journal of Vacuum Science & Technology B, vol. 23, No. 6, Nov./Dec. 2005, pp. 2705-2710.

Wei Li et al., "Extreme ultraviolet Talbot interference lithography," Optics Express, 2015, vol. 23 (20), pp. 25532-25538.

International Search Report and Written Opinion received for PCT Patent Application No. PCT/AU2020/050543, mailed on Jul. 20, 2020.

* cited by examiner

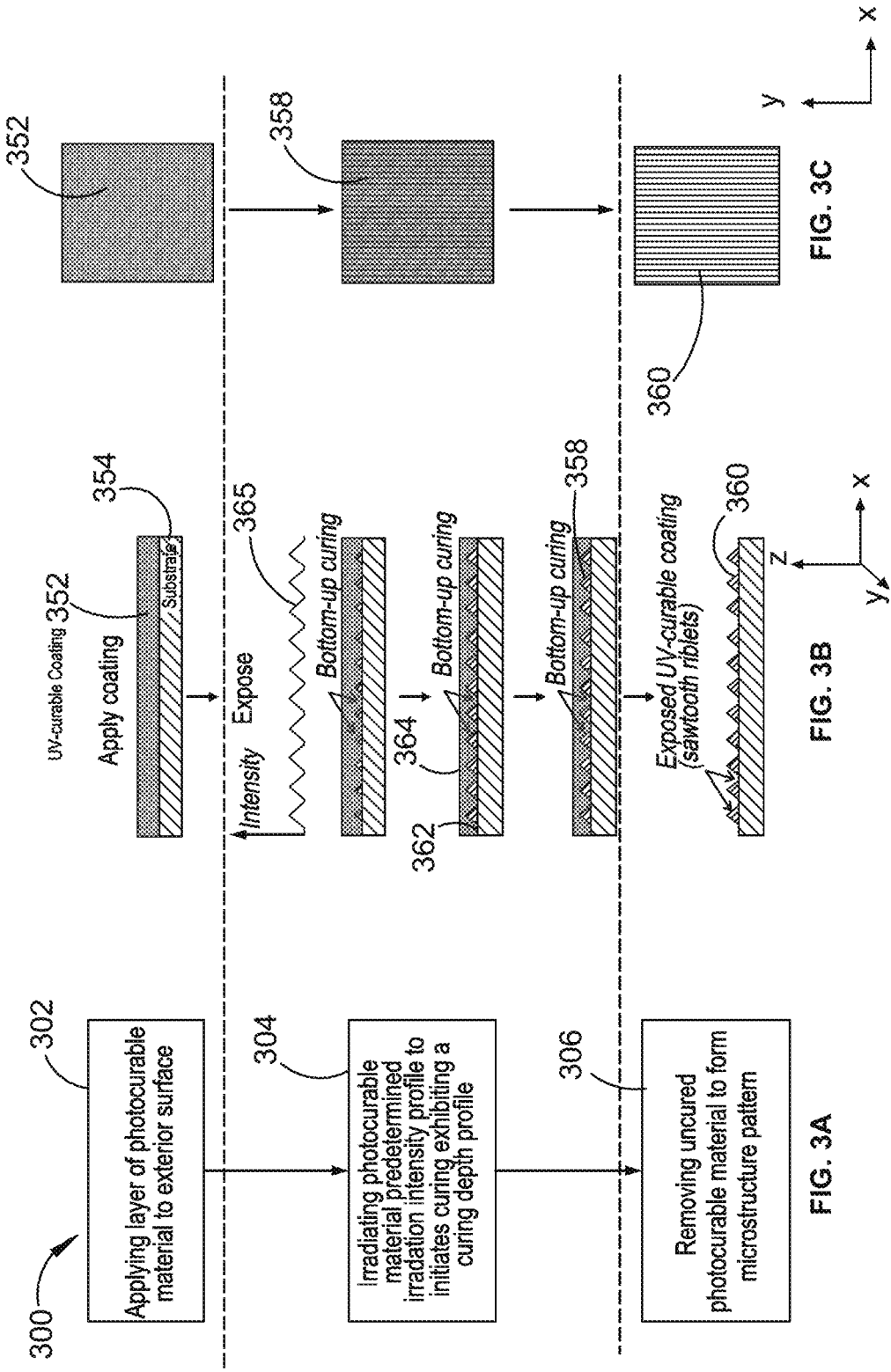

Continuous riblet exposure

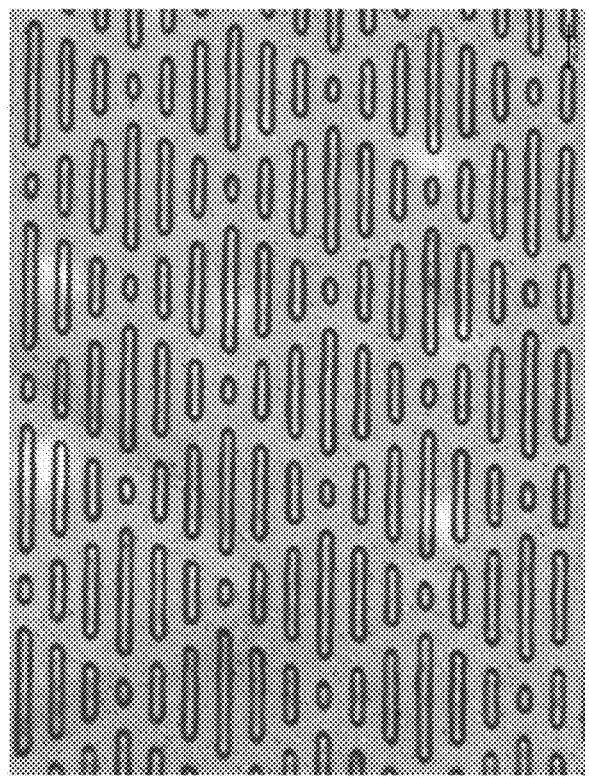
Example of resulting microstructures fabricated with said intensity profile (optical microscopy)
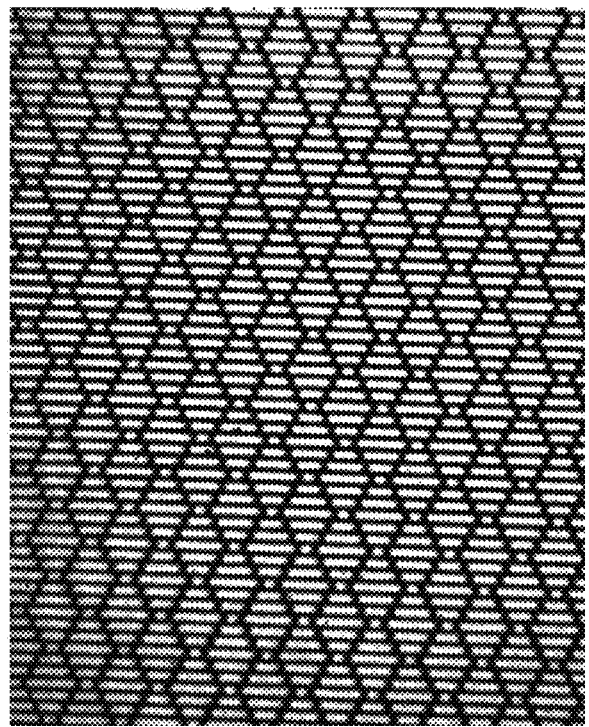
Example of intensity profile replicating photomask pattern with Talbot effect
FIG. 13(b)

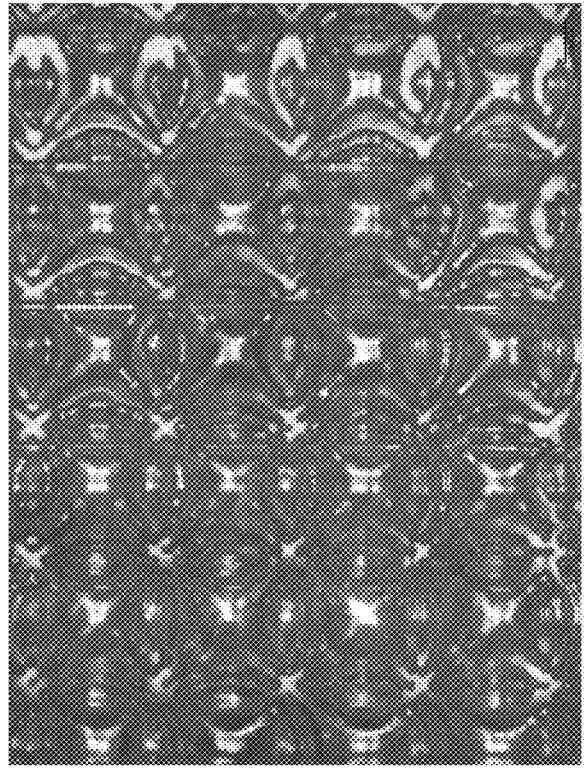
Example of resulting microstructures fabricated with said intensity profile (optical microscopy)
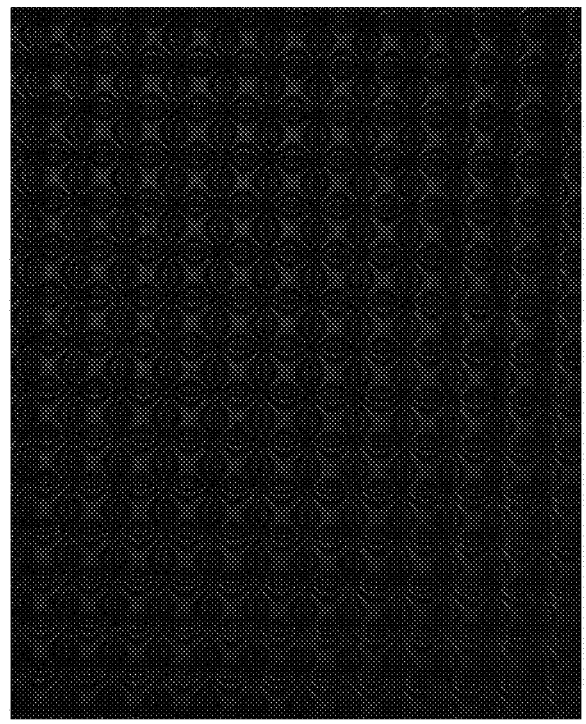
Example of intensity profile pattern made with Talbot effect
FIG. 13(c)

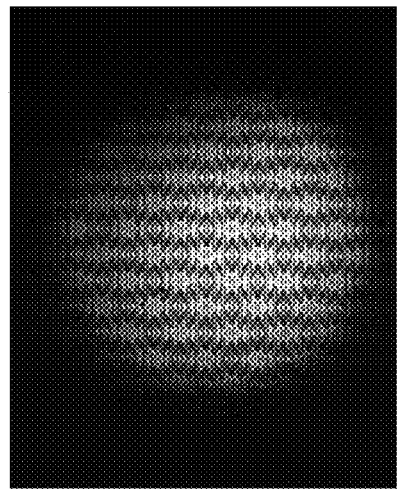
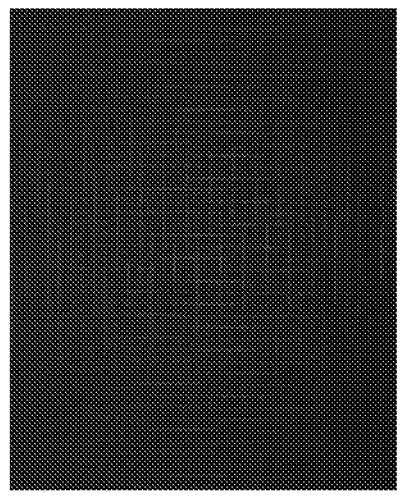
FIG. 13(d)

SYSTEMS AND METHODS FOR FABRICATING MICROSTRUCTURES

CROSS-REFERENCE TO RELATED APPLICATIONS

This application is a 35 U.S.C. § 371 national stage application of PCT International Application No. PCT/AU2020/050543, filed on May 29, 2020, which claims the benefit of Australian Patent Application No. 2019901869, filed May 30, 2019. The contents of the above patent application are hereby incorporated by reference in their entirety.

FIELD

The present disclosure relates to methods and systems for fabricating microstructures on substrate surfaces.

RELATED APPLICATION

The disclosure of the present application is related to international patent publication WO 2017/063040 A1 (Bilinsky), the entire disclosure of which is incorporated herein by reference.

BACKGROUND

Microstructures have been created or imprinted on a substrate surface using optical systems. For example, a light source and a mask have been used to selectively irradiate a photopolymer. Different types of light sources and masks have been used, which have various problems associated with them. For example some systems suffer from problems arising due to disturbances caused by the movement of the mask, substrate or other components. In another example, some systems have an inadequate processing speed at least for some applications. In another example, some systems have a high cost associated with changing the design of the microstructure (e.g. expensive or consumable masks to be fabricated for every new design). In another example, some systems require or are mainly suited to use in a highly controlled cleanroom environment, which may increase the cost and reduce the applications of the systems.

SUMMARY OF THE DISCLOSURE

The present disclosure includes methods for forming microstructures.

A method for forming microstructures includes applying, to a photocurable material, at least one image of light or radiation for curing the photocurable material.

In some embodiments the light or radiation is light from one or more lasers. The one or more lasers may be diode lasers, high power gas lasers, tuneable frequency lasers or another type of lasers.

The image may be formed by near-field diffraction of the light or radiation and include areas of higher intensity adjacent to areas of lower intensity.

The image may be maintained or substantially maintained for a duration sufficient to effect curing of the photocurable material. For instance substantially only a single image is applied to the photocurable material, instead of a plurality of images or a progressively changing pattern between two or more images.

The image may be substantially a Talbot image formed at a multiple of a quarter or a half of a Talbot length. Using a half Talbot length may have certain advantages.

The image may be substantially a fractional Talbot image whereby images of the mask are formed at higher feature density, for example spatial frequency is double at a quarter of a Talbot length, triple at a sixth of a Talbot length, quadruple at an eight of a Talbot length, and so on. Fractional Talbot images also form at multiples of these lengths.

The method may involve use of non-monochromatic light to form the image and cure the photocurable material. The light may be multimodal light.

The method may include applying a first image formed by a first diffraction grating and a second image formed by a second diffraction grating that is offset from the first diffraction grating. The first diffraction grating and the second diffraction grating may both comprise slits with a first separation distance and wherein the offset is substantially equal to half the first separation distance. The first image and the second image may traverse the photocurable material whereby the areas of higher intensity of the first image are interleaved with the areas of higher intensity of the second image.

The method may include the use of two or more diffraction gratings which are offset from one another, wherein each diffraction grating produces one image. The images produced by two or more diffraction gratings are interleaved and form a resulting image for application on the substrate comprising the photocurable material.

The method may further include producing different images of light pattern (e.g. Talbot images) using a dynamic photomask. The dynamic photomask transitions from a first image of light pattern to a second image of light pattern during the application of light pattern on the substrate. The transition may be substantially instantaneous (i.e. little or curing occurs during the transition). In other words, the dynamic photomask may switch between different Talbot images during the application process, with the images being maintained or substantially maintained for a duration sufficient to effect curing of the photocurable material and any other transitional images not being maintained for a duration sufficient to effect curing the photocurable material. In an embodiment the dynamic photomask is a Digital Micromirror Device (DMD). In some embodiments there are three or more different images that the dynamic photomask transitions between. In some embodiments the dynamic photomask is maintained at a fixed or substantially fixed distance from the photocurable material whilst the two or more images are applied.

In some embodiments the image has a periodic or a quasi-periodic pattern.

In some embodiments the image has a periodic or quasi-periodic pattern in two dimensions.

In some embodiments the photocurable material is on a substrate that is transparent or semi-transparent to the light or radiation and the application of the at least one image is through the transparent or semi-transparent substrate. In an embodiment, the transparent or semi-transparent substrate may be in the form of multiple sheets and the method includes providing a first sheet of substrate and applying the at least one image of light or radiation at the first sheet of substrate, replacing the first sheet of substrate with the next sheet of substrate and further applying at least one image of light or radiation on the next sheet of substrate and so on (i.e. a sheet-to-sheet process). In an alternate embodiment, the transparent or semi-transparent substrate may be from a roll and the method may include transferring the substrate from the roll to another roll and applying the at least one image of light or radiation at an intermediate point between the two rolls (i.e. a roll-to-roll process).

The microstructures have a height between 0.10 and 250 microns (inclusive), for example, between 25 and 250 microns (inclusive) or between 0.1 and 5 microns (inclusive).

The microstructures may be left within the photocurable material, for example to form an optical effect. Alternatively one of the cured or uncured photocurable material may be partially or fully removed. Where the uncured photocurable material remains, said material and the cured microstructures within it may then be non-selectively irradiated with largely uniform radiation to complete curing of all photocurable material. For example, a lower intensity, non-monochromatic ultraviolet flood lamp may be used.

Applying the at least one image of light or radiation may be by a portable applicator. The portable application may include at least one light source for providing the applied light and an optical system for receiving light from the at least one light source and generating the at least one image.

In some embodiments a method for forming structures in a photocurable material includes applying, to the photocurable material, a plurality of images of light or radiation for curing the photocurable material, wherein each image comprises areas of higher intensity adjacent to areas of lower intensity and the plurality of images are applied to create an interleaved image, in which areas of higher intensity of one image are applied in locations of lower intensity for the other image. The plurality of images of light or radiation are produced by illuminating a plurality of diffraction gratings. The plurality of diffraction gratings may be illuminated by a single light source or by multiple light sources, each light source arranged in a one to one or a one to a plurality relationship with their respective grating(s).

In some embodiments, the plurality of interleaved images include a first image that is periodic or quasi-periodic across a first dimension and a second image that is periodic or quasi-periodic across the first dimension and the method includes moving the first and second images relative to the photocurable material, the movement including at least a component transverse to the first dimension. During the movement, the first image and/or the second image are maintained.

In some embodiments the first image of the interleaved images is offset from the second image of the interleaved images in an offset direction, the offset direction transverse to the first dimension.

In some embodiments a method for forming structures in a photocurable material includes applying, to the photocurable material, at least one image of light or radiation for curing the photocurable material, wherein each said image comprises areas of higher intensity adjacent to areas of lower intensity and comprises an image in two dimensions. The method may include not removing the cured or the uncured photocurable material.

In some embodiments, the method is a method for imparting optical effects, for example for a label, document, security document or for another object such as an item of furniture. Where the uncured photocurable material remains, said material and the cured microstructures within it may then be non-selectively irradiated with largely uniform radiation to complete curing of all photocurable material. For example, a lower intensity, non-monochromatic ultraviolet flood lamp may be used.

The image may be a periodic or quasi-periodic image in two dimensions. The image may be applied to the distal side of the photocurable material from a substrate carrying the photocurable material. The image may be applied to the proximal side of the photocurable material to a substrate carrying the photocurable material, the substrate being transparent or semi-transparent to the light or radiation.

In some embodiments a method for forming structures in a photocurable material includes applying, to the photocurable material, at least one image of light or radiation for curing the photocurable material, wherein each said image comprises areas of higher intensity adjacent to areas of lower intensity, wherein the photocurable material is provided on a substrate comprising transparent or semi-transparent material and the light or radiation is applied to the photocurable material through the substrate.

In some embodiments the substrate comprising transparent or semi-transparent material is provided on a roll and the method comprises transferring the substrate from one roll to another and applying the at least one image of light or radiation at an intermediate point between the two rolls. In some embodiments each of the images is substantially one-dimensional and extends across the substrate at the intermediate point. In some embodiments there are at least two interleaved images.

In some embodiments a method for creating an object comprises printing the object in three dimensions, the printing comprising applying a photocurable material to form the object and applying, to the photocurable material, at least one image of light or radiation for curing the photocurable material, wherein each said image comprises areas of higher intensity adjacent to areas of lower intensity.

In some embodiments the method further includes removing cured or uncured photocurable material and then applying further curing light or radiation. The further curing light or radiation may comprise substantially uniform radiation across a surface of the object to which a said image was applied.

In some embodiments, the method further includes removing from the object uncured photocurable material. The removal may be by a solvent.

The present disclosure also includes an apparatus for forming microstructures. The apparatus may be configured to perform any of the methods described herein.

In some embodiments the apparatus comprises a diffraction grating for creating the image. In some embodiments there are a plurality of diffraction gratings, on the same or separate carriers, each creating one of the images.

In some embodiments the light or radiation is not monochromatic. For example, the light or radiation may be multimodal light. The light may be provided by one or more light sources comprising laser diodes. There may be separate light sources for each diffraction grating. Alternatively two or more diffraction gratings may share a light source.

In some embodiments the apparatus is portable. The portable apparatus may include the light source(s) and diffraction grating(s).

Further aspects of the present disclosure will become apparent from the following description, given by way of example and with reference to the accompanying drawings.

BRIEF DESCRIPTION OF THE DRAWINGS

FIG. 3 shows method steps of patterning a substrate using the optical system of FIG. 2, in accordance with an embodiment of the invention;

FIG. 8(d) shows combined intensity profiles $I_1$ and $I_2$ produced by gratings $g_1$ and $g_2$, respectively, for printing microstructures on a substrate;

FIGS. 13(a)-(d) show different periodic and quasi-periodic pattern examples.

DETAILED DESCRIPTION OF THE EMBODIMENTS

Figure 1:
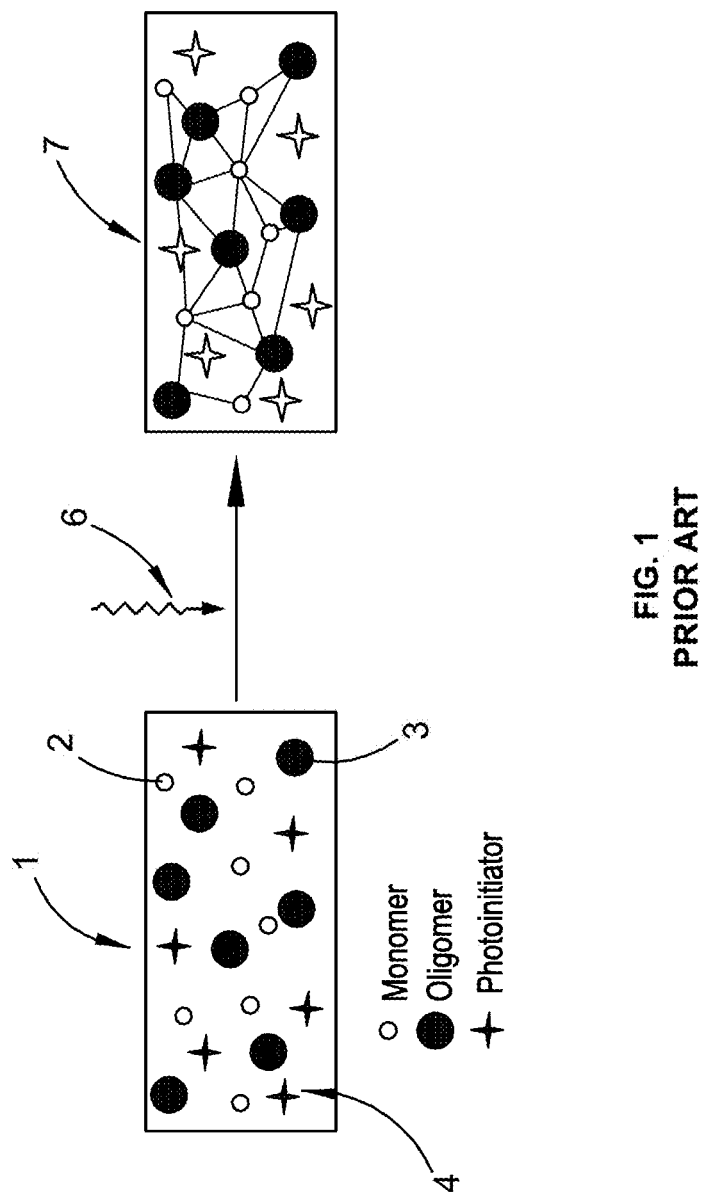
FIG. 1 is a schematic representation of a photopolymer before and after irradiation.

The methods and systems disclosed herein relate to fabricating microstructures or microstructure patterns on a substrate surface (herein referred to as micropatterning). These methods and systems can be used for a range of applications. For example, micropatterning drag-reducing microstructures on the exterior surface of an aircraft, vehicle, boat, ship or other vehicles helps in reducing the resistance posed by the fluid such as air or water etc. and hence increases range or speed and reduces fuel consumption. In another example, micropatterning anti-reflective microstructures can produce aesthetic effects for furnishings, packaging or decorative finishes on vehicles. In another example, micropatterning anti-bacterial microstructures on hospital surfaces, medical devices or high-touch surfaces can help reduce spread or risk of infection. In another example, micropatterning any number of functional microstructures onto flexible plastic films can allow said films to then be affixed to the desired surface in which specific functional properties are desired. Functional microstructure properties include, but are not limited to, anti-bacterial, anti-fouling, anti-reflective, superhydrophobic, superoleophobic, superomniphobic, ice phobic, self-cleaning, noise-reducing, drag-reducing, and dry or switchable adhesion.

Some embodiments of the disclosure provide specific techniques and optical systems for effectively fabricating microstructure patterns on a substrate. In some embodiments microstructures fabricated onto a substrate according to the present disclosure have any height within the range of 0.10 microns to 250 microns (inclusive), with the microstructures on the substrate either all having substantially equal or similar heights, or including microstructures of dissimilar heights. In some embodiments, the microstructures substantially all have a height equal to or greater than any of 0.10 microns, 0.20 microns, 0.50 microns, 1 micron, 2 microns, 10 microns, 50 microns, 100 microns, 150 microns or 200 microns or any value in between. These microstructures can have a width of between 1 micron to 20 microns (inclusive), or greater. For example, the microstructures can have a width of greater than 1 micron, 2 microns, 5 microns, 10 microns, 15 microns, 20 microns, 25 microns or any value in between. In some embodiments of the present disclosure, the spacing between the adjacent microstructures can be in the range of 1 micron to 150 microns or any value in between.

In some embodiments of the present disclosure, drag-reducing microstructures are produced with heights between about 25 microns to 100 microns, widths between about 1 micron to 20 microns, and spacing between adjacent microstructures between about 50 microns to 150 microns. In some embodiments a substrate for use or when used as a drag reducing structure includes microstructures with these characteristics. In some embodiments a vehicle includes such a substrate for drag reduction.

In some embodiments of the present disclosure, microstructures with antibacterial or similar functional properties are produced with heights between about 0.1 microns to 5 microns, widths of between about 2 microns to 10 microns, and spacing between the adjacent microstructures of about 2 microns to 10 microns. In some embodiments a substrate for use or when used for antibacterial or similar reasons includes microstructures with these characteristics.

In further embodiments of the present disclosure, microstructures with optical effects, for example matte effects, include heights of between about 0.1 microns to 5 microns, widths of about 2 microns to 10 microns, and spacing between adjacent microstructures of about 2 microns to 50 microns. In some embodiments a substrate for use or when used for optical effects, for example decorative or security purposes, includes microstructures with these characteristics. The substrate may be included in or substantially consist of a decorative substrate or a security document or label.

Photocurable materials such as photopolymers are known from photolithographic techniques developed for computer microchip fabrication and, as illustrated schematically in FIG. 1, the photopolymer 1 consists of a mixture of smaller molecules (monomers 2 and oligomers 3) and a photoinitiator 4. After exposure to ultraviolet light 6, or radiation, normally via a mask, the photoinitiator catalyses a polymerization reaction between the monomers 2 and the oligomers 3, causing them to cross-link up into larger network polymer molecules and thereby form the cured polymer. These network polymers change their chemical and structural properties. So-called "negative photopolymers" become insoluble and stronger than the unexposed photopolymer. However, so-called "positive photopolymers" become soluble and thus weaker than the unexposed photopolymer.

Microstructures can be made by applying a layer of photopolymer to a substrate and, using the disclosed methods and systems, selectively exposing it to light or radiation, for example UV light. The selective exposure allows for the formation of microstructures in a pattern. In some embodiments, for example where optical effects are required, the photopolymer is not removed to expose the microstructures. In some other embodiments, the unexposed negative photopolymer is removed, for example through use of a developer liquid that washes away the unexposed photopolymer, thereby leaving the exposed photopolymer with the microstructures. Alternatively the exposed positive photopolymer is removed. In some embodiments, the photopolymer is physically removed, for example using a fluid directed under pressure onto the photopolymer, such as one or more jets or streams of compressed air. In some embodiments physical removal is aided by the application of heat to reduce the viscosity of the unexposed photopolymer. In some embodiments a combination of photopolymer removal techniques are used, for example physical separation followed by use of a developer liquid or vice-versa. In other embodiments, the unexposed and exposed photopolymers are both retained in part. In other embodiments the unexposed and/or exposed photopolymers are partially removed, so that a portion of each of a plurality of microstructures of the substrate is within the substrate (i.e. within photopolymer that has not been removed) and a portion protrudes from the substrate. In some embodiments, further curing light or radiation may be used. The further curing light or curing radiation may comprise substantially uniform radiation across the remaining exposed and or unexposed photopolymer.

In some embodiments, an etchant is then applied which attacks the substrate but not the remaining photopolymer. The etchant may for example, be a liquid etchant. Other etching methods may be used, such as by a plasma. In these embodiments, the microstructures are either a) structures formed by etching, in which case the remaining photopolymer may also be removed after etching, or b) structures formed by a combination of etching and photopolymer, in which case the remaining photopolymer may be retained or only partially removed.

Figure 2:
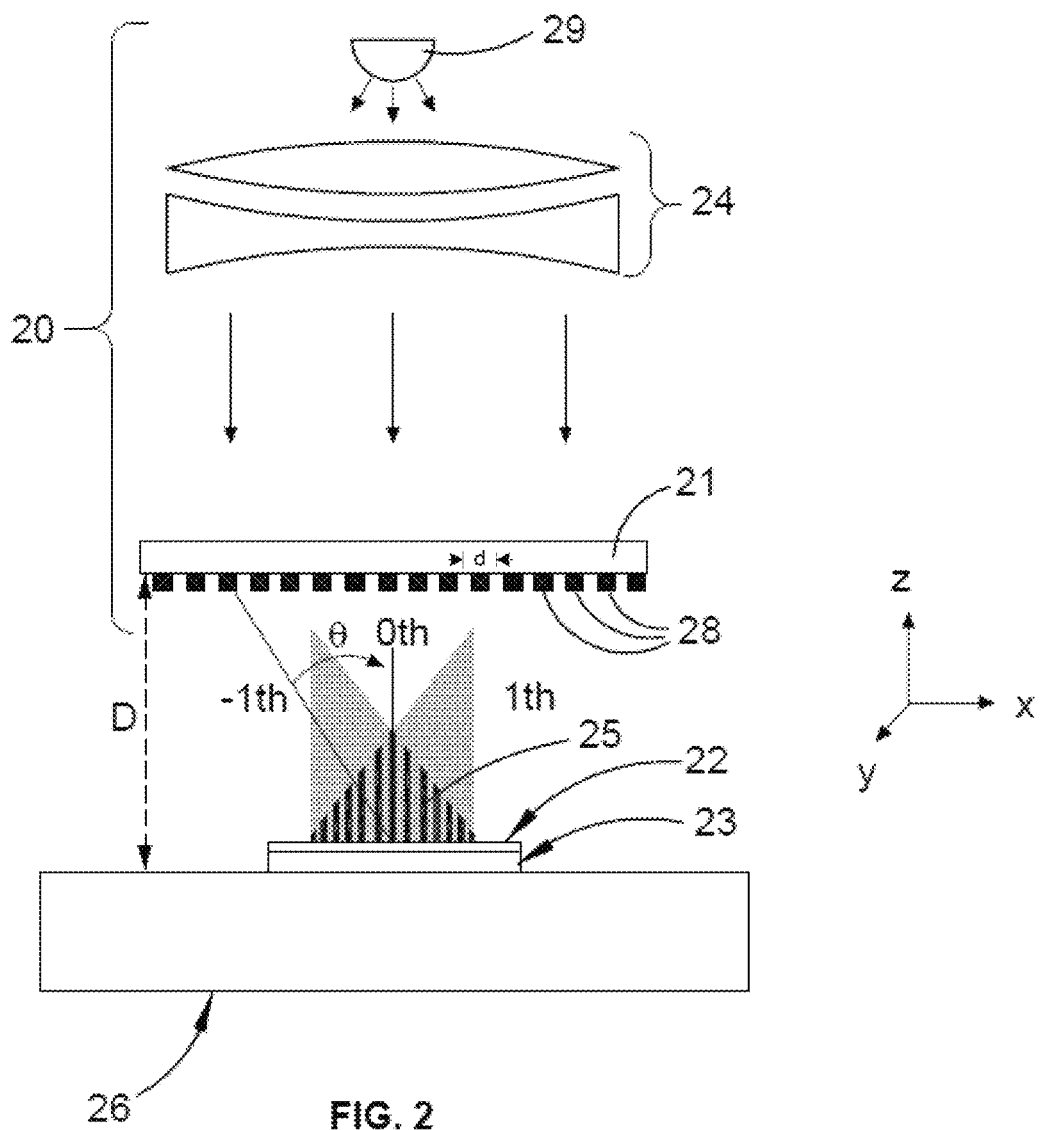
FIG. 2 is an optical system utilising a diffraction grating in accordance with an embodiment of the invention.

The selective exposure of the photopolymer is achieved by creating an interference pattern in the light or radiation. In some embodiments the interference pattern is formed by a diffraction grating. In some embodiments, the diffraction grating includes slits. In some embodiments, the slits of the diffraction grating are arranged in equi-spaced lines. FIG. 2 shows operation of such a diffraction grating 21 with line spacing "d" between adjacent slits (represented by spaces between substrate portions 28) and located at a distance "D" from a substrate 23 to produce an optical profile 25 for fabricating microstructures on the substrate 23. The substrate is provided with a photocurable layer 22.

A light source 29 that emits light for curing the photocurable layer of the substrate is provided. In an embodiment, the light source emits ultra-violet (UV) light. In other embodiments, the light source may be a near-UV or far-UV light source. The light source 29 is selected from monochromatic, non-monochromatic, single mode or multimode to achieve the desired or required outcomes. In some embodiments the wavelength of the light emitted is adjustable, for example between two or more different wavelengths or across one or more ranges of wavelengths.

In some embodiments the light source produces a collimated beam of light. The light source may include one or more optical components that collimate the light into the collimated beam. In an embodiment, the light beam produced by the light source is collimated by a lens. In other embodiments, the light beam is non-collimated (i.e. converging or diverging).

In an embodiment, the light beam is normal or approximately normal to the surface of the diffraction grating 21. In other embodiments, the light beam is non-normal to the surface of the diffraction grating 21. In still other embodiments the light beam is orientable in two or more different orientations relative to the diffraction grating 21. In an embodiment, the light beam is uniformly illuminated on the diffraction grating 21.

In the example of FIG. 2, the light source 29 is used with a collimating lens system 24 for collimating the light beam. The collimated light beam is shown as uniformly illuminating the grating 21. The light beam diffracts through the slits of the grating to produce the irradiance profile 25 (an interference pattern) on the photocurable layer 22 of the substrate 23. The interference pattern is formed of alternating maxima (bright fringes) and minima (dark fringes) with defined spacing "a". The spacing "a" between adjacent maxima or minima depends on various parameters, including the line spacing "d" of the grating 21, the wavelength(s) of light source 29, the type of the light source 29 (monochromatic, non-monochromatic, single mode, multimode), and the incidence angle(s) of the light beams on the grating surface (normal incidence is shown in FIG. 2). All of these parameters may be fixed or some may be variable to effect variations in the irradiance profile 25 as they are changed. In an embodiment, the light source may include one or more lasers. The laser used to source light may be a diode laser, a high power gas laser, a tuneable frequency laser or another type of laser.

The irradiance profile 25 of the grating is used for fabricating microstructures on the substrate. For example, the portions of the photopolymer layer 22 which are exposed to the peaks (maxima) of the irradiance profile are cured. The cured portions of the photopolymer layer 22 remain after developing and rinsing steps (if any). In some embodiments, further curing light or radiation may be used. The further curing light or curing radiation may comprise substantially uniform radiation across the remaining exposed and or unexposed photopolymer.

Accordingly, controlling variables of the system, including for example the intensity profile (spatially and/or temporally), exposure duration, relative positioning of the grating to the substrate and/or selecting or controlling between continuous and discontinuous exposure (and/or one of more of the other variables described herein), can enable formation of microstructures of various sizes (the controlled size including any one or more of length, width and height of a microstructure), shapes and spacing. In some embodiments, there is a single exposure. Due to the use of one or more of the controlled variables, a single exposure can result in various sized, shaped and/or spaced microstructures.

It has been observed that the peaks corresponding to the highest radiation intensity in the irradiance profile 25 produce the largest microstructure heights, whereas the lower intensity radiations in the irradiance profile 25 produce microstructures with relatively smaller heights (variation in height of microstructures is not shown in FIG. 2). The irradiance pattern 25 as shown in FIG. 2 has alternating maxima which are of different radiation intensities. The central maxima ($0^{th}$ order maxima) is shown as having the highest intensity. The intensity of the remaining maxima on either side of the central maxima is gradually decreasing as the distance from the central maxima increases. Therefore, the irradiance profile 25 produces different cured heights because of exposure to different radiation intensities of the maxima which results in microstructures of different heights.

FIG. 3 shows method steps of creating microstructures on a first surface of a substrate 354. In FIG. 3A, the described method 300 comprises the step 302 of applying a layer of photocurable material 352 to the exterior surface of a carrier to form the substrate 354. Alternatively, the method may commence with recept of the substrate 354 with the photocurable material 352 already applied. In one embodiment, the photocurable material has a thickness of 0.1-5000 microns, or 5-1000 microns, or 10-800 microns, or 50-500 microns, or 100-200 microns (inclusive). After this, at step 304, an irradiance profile is applied to the substrate 354, for example using the optical system 20 of FIG. 2 to apply the irradiance profile 25. The radiation initiates curing of the irradiated photocurable material, causing a curing depth profile across the layer of the photocurable material corresponding to the intensity profile.

At step 306 uncured photocurable material is removed to form the microstructure. In an embodiment, the formed microstructures may constitute a microstructure pattern. The removing step 306 may occur after completion of the curing or after partial completion of the curing.

FIGS. 3B and 3C illustrate schematically a side view and a top view, respectively, of an example of the intermediate or final output after each of steps 302-306 of the described method 300. In this example, the layer of photocurable material is a UV-curable or near-UV-curable coating 352, which upon curing adheres to the exterior surface. The coating 352 may be designed for specific use, such as up to military specifications including the MIL-PRF-85285 specifications. In another instance, the coating 352 is primer-surfacer Cromax 3130S. In another instance, the coating 352 is another UV-curable coating, of which a number are commercially available. In this example, the exterior surface is a substrate 354, such as the top coat of a vehicle. In the example illustrated in FIGS. 3B and 3C, the predetermined irradiation intensity profile is a sawtooth irradiation intensity profile 356. In this illustrative example, where the intensity-to-curing-depth correspondence is a linear relationship, the resulting microstructure pattern includes sawtooth riblet geometry 360. In another example, where the intensity-to-curing-depth correspondence is a non-linear relationship, the resulting microstructure pattern includes scalloped riblet geometry. In a practical system there may be a logarithmic relationship between intensity and curing depth and a required microstructure or riblet geometry can be formed having regard to this relationship.

In some embodiments, the substrate 354 may be installed on a mount of a translational stage and/or the optical system (e.g. the optical system 20) may be provided on a moveable mount. The substrate 354 and the optical system 20 can then be moved in one or more of x- and/or y-directions relative to each other, for example under computer control. The movement may be at a constant speed or a variable speed, depending on requirements. For example, a variable speed may result in corresponding variation in the microstructure size and/or shape. Therefore, while the irradiance intensity profile of the grating is irradiating the photopolymer layer of the substrate, the substrate and intensity profile can translate in a desired direction. This provides a continuous irradiation of the photopolymer layer leading to a continuous growth of microstructures on the substrate. The speed of the translation may provide a specific shape of the microstructures.

Figure 4A:
FIG. 4(a) shows an intensity pattern produced by a one-dimensional grating.
Figure 4B:
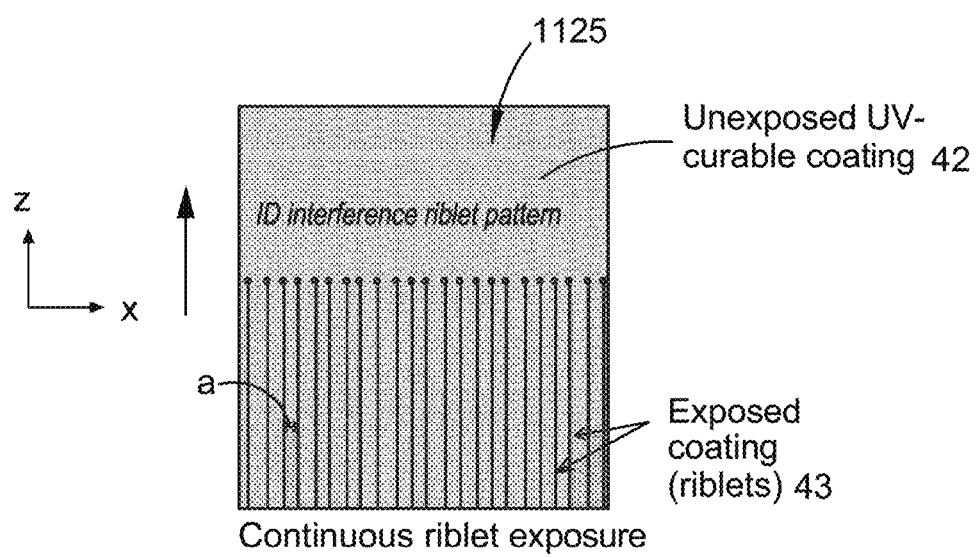
FIG. 4(b) shows an example of a microstructure arrangement on a substrate produced by the intensity pattern of a one-dimensional grating.

FIG. 4(b) shows an example of a microstructure arrangement on a substrate that can be achieved using a one-dimensional grating in the optical system 20 of FIG. 2. The continuous riblet pattern on the photopolymer layer of the substrate is achieved by translating the substrate/optical system along y-axis while the photopolymer layer is exposed with the intensity pattern 41 produced by the 1D grating as shown in FIG. 4(a).

Figure 4C:
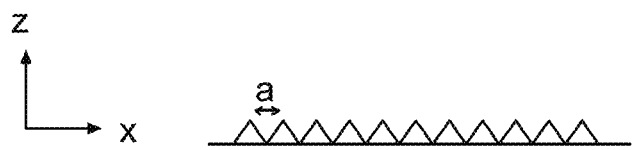
FIGS. 4(c) and 4(d) show a sawtooth riblet microstructure pattern and a scalloped riblet pattern, respectively.
Figure 4D:
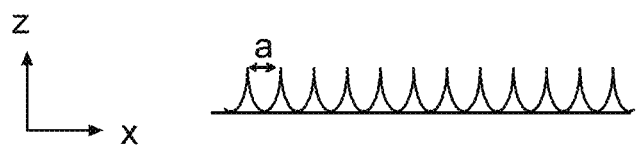

As a first example, a sawtooth riblet microstructure as shown in FIG. 4(c) may be formed on the substrate. This type of pattern is generally obtained when the intensity-to-curing-depth correspondence is a linear relationship and the substrate/optical system is moved along Y-axis with a constant speed. In a second example, a scalloped riblet geometry like that shown in FIG. 4(d) is achieved where the intensity-to-curing-depth correspondence is a non-linear relationship.

Figure 5:
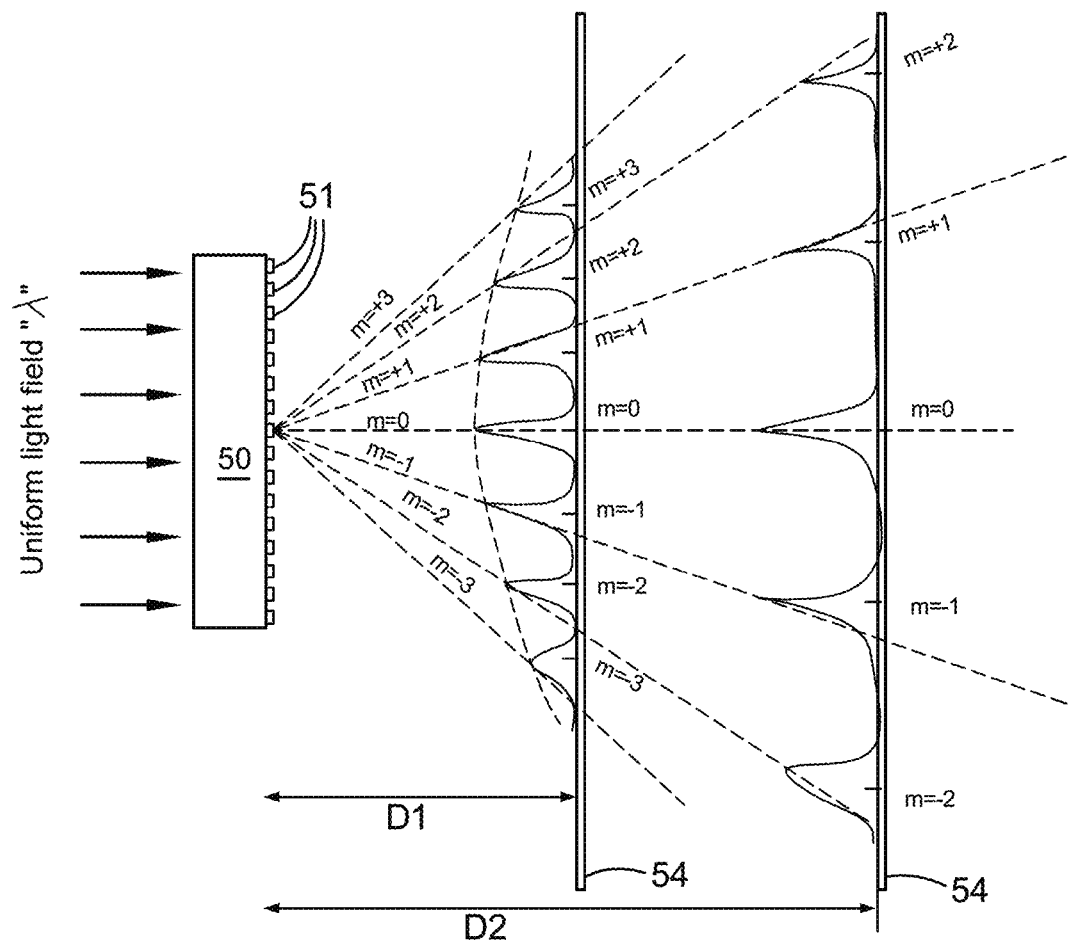
FIG. 5 shows a diffraction pattern formed using a one dimensional grating.

FIG. 5 shows a one dimensional grating 50 having multiple slits 51. A monochromatic light source (not shown) is illuminating the grating 50 at normal incidence. The intensity profile of the far field diffraction pattern 53 has multiple peaks. The condition for maximum intensity (i.e. intensity peak) is the given by grating equation: d (sin $\theta_i$–sin $\theta_m$)=m$\lambda$, where $\theta_i$ is the angle of incidence and is 90° for normal incidence of light. $\theta_m$ is the angle of diffraction, m refers to the mode of diffraction and m=0, +/−1, +/−2, +/−3 and so on. It is evident from the grating equation that different wavelengths of the incident light diffract at different angles.

The Talbot Effect is understood by the applicant to have been first observed in 1836 by Henry Fox Talbot. Talbot effect is understood as the near field effect of the self-imaging of a diffraction grating at regular distances from the grating. In other words, when a plane wave is transmitted through a diffraction grating or other periodic structure, the resulting wave front propagates in such a way that it replicates the grating structure at multiples of a certain defined distance, known as the Talbot length $Z_T$.

Figure 6:
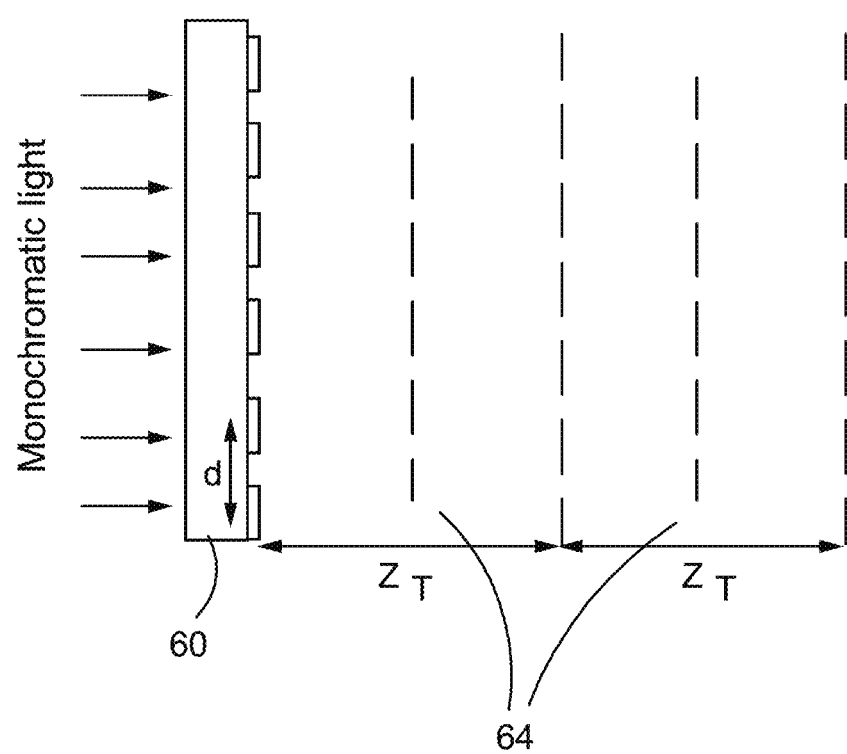
FIG. 6 illustrates the concept of Talbot effect formed by illuminating a diffraction grating 60.

FIG. 6a illustrates the concept of the Talbot effect. A diffraction grating 60 is illuminated. The light emanating from the grating forms images of the grating ("primary images 62") at integer multiples of Talbot length $Z_T$, i.e. at $Z_T$, $2Z_T$, $3Z_T$ and so on. In addition secondary images 64 are shifted by half the grating spacing i.e. d/2, and appear at integer multiples of one-half Talbot length $Z_T$, i.e. at $\frac{1}{2}Z_T$, $3/2Z_T$, $5/2Z_T$ and so on. There are also other images appearing at integer multiples of $\frac{1}{4}Z_T$, $\frac{1}{6}Z_T$, $\frac{1}{8}Z_T$, $\frac{1}{10}Z_T$, $\frac{1}{12}Z_T$, $\frac{1}{14}Z_T$, $\frac{1}{16}Z_T$, and so on.

The applicant has observed that non-collimated and/or non-monochromatic light sources can be used to produce microstructures, for example multimode light sources. The Talbot distance $Z_T$ depends on the wavelength of the light used to illuminate the grating. Therefore, for a non-monochromatic light source (or a multi-mode light source) Talbot images for different wavelengths are formed at different Talbot lengths. In the case of a distribution of wavelengths about a centre frequency there will be a corresponding distribution of Talbot images, centred about the Talbot length for the centre frequency. When the Talbot image distribution caused by the wavelength distribution of a non-monochromatic light source is not desirable, its effects can be reduced or minimised by selecting a small Talbot length, e.g. $Z_T/2$, as the operating distance.

One advantage of operating in the near field at the location of a Talbot image is that it provides higher optical intensity in the peaks intensity profile. Accordingly, a larger operating distance D can be utilised to effectively produce microstructure patterns on a substrate for a given intensity of the light source. The peaks are highest at the integer multiples of $Z_T/2$ and progressively lesser at increasing fractional Talbot lengths e.g. at $Z_T/4$, $Z_T/6$ . . . $Z_T/2n$.

In addition, smaller Talbot lengths are also associated with a smaller depth of focus of the Talbot images and larger Talbot lengths are associated with a larger depth of focus of the Talbot images. The depth of focus is the variation in the operating distance that ensures that the irradiance profile hitting the printing surface is sufficiently in focus to print acceptable microstructures. Larger depths of focus mean that the optical system and/or substrate is more tolerant of positioning errors or variations in position during micropatterning, which can affect the shape/size of the microstructures. Such variations may occur, for example when micropatterning an uneven/non-planar substrate surface or due to shaking of the substrate/grating. This enables printing outside of a cleanroom environment where such uneven/non-planar substrate surfaces, shaking or vibrations are common.

The methods and systems of the present disclosure involve micropatterning at an operating distance (the distance between the diffraction grating and the photopolymer) that corresponds to a Talbot image and which balance the variables above. The operating distance may be constant or may be substantially constant, whereby the Talbot image is present for all or substantially all of the curing process. In other words, when curing a portion of a photocurable material on a substrate, the operating distance is not changed or at least not changed to such an extent that substantial curing occurs in accordance with a different interference pattern. In certain preferred embodiments the operating distance is at an integer (n) multiple of the Talbot length, that is at one of $Z_T$, $2Z_T$, $3Z_T$, $4Z_T$ . . . $nZ_T$. In other embodiments the operating distance is at ½m integer (m) multiples, for example at integer multiples of $½Z_T$, $¼Z_T$, $⅙Z_T$, $⅛Z_T$, and so on. For example, particular embodiments may image at any of $½Z_T$, $1Z_T$, $1.5Z_T$, $2Z_T$, $3/2Z_T$, $2Z_T$, $5/2Z_T$, $3Z_T$, $7/2Z$ and so on. In some embodiments, the operating distance is equal to or less than $6Z_T$. In some embodiments, the operating distance is selected between $2Z_T$ and $4Z_T$. In some embodiments, the operating distance is one-half Talbot length ($½Z_T$).

One advantage of using one half Talbot length ($½Z_T$) as the operating distance is that it is the shortest distance that produces the Talbot image of the photomask that has features of the same size as the features of the original photomask (i.e. 1:1 feature ratio). Using one-half Talbot length ($½Z_T$) as the operating distance allows the photomask to be held at the shortest distance from the printing surface that produces a 1:1 image of the photomask that minimises edge effects and provides a good resolution of the resulting Talbot image. Furthermore, using one-half Talbot length ($½Z_T$) as the operating distance still provides a relatively large focal depth. This also results in less "blurring" due to wavelength distributions when using a multi-mode or non-monochromatic light source. Therefore, using one half Talbot length ($½Z_T$) as an operating distance facilitates the use of a broader spectrum light source which are generally cheaper than mono-chromatic light sources.

Therefore, a balance is achieved between the intensity of light produced by the light source (generally higher intensity light sources are more costly and lower intensity light sources less costly, also single wavelength laser diodes are more expensive than multiple wavelength laser diodes) and the variables discussed above associated with the operating distance. The inventor has identified a need for developing effective methods and optical systems which allows micropatterning outside the laboratory environment, for example, directly on the exterior surface of an aircraft. This generally requires larger operating distances D and a larger depth of focus to compensate for any shaking of the surfaces/optical components and uneven/non-flat exterior of the aircraft. At the same time, it is preferable to use lower cost light sources.

Embodiments of the present disclosure are directed to an optical system that takes advantage of the Talbot Effect for enabling micro-scale repeating or quasi-repeating intensity profiles at large operating distances with large depths of focus. This enables practical, low-cost and scalable exposure of photocurable materials for fabricating repeating microstructures on large areas.

In an example selection of the controllable variables, selected to enable production of drag-reducing riblet microstructures spaced at about 100 microns, a photomask is used with slit spacing of about 200 microns. The slit width may be about 10 microns. Two passes are made over the substrate, the second pass offset from the first to create an interleaved print at the required 100 micron spacing. A 405 nm laser diode may be used as the light source, and the operating distance is at half the Talbot length.

Figure 7:
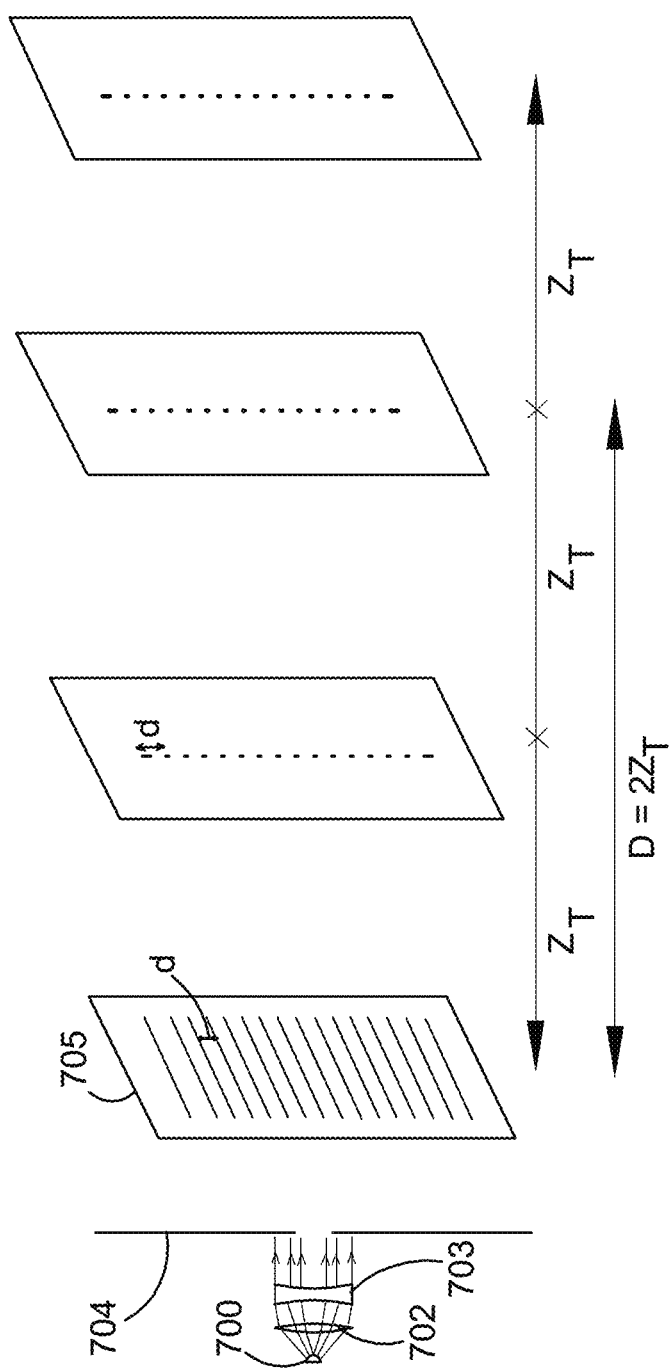
FIG. 7 shows a schematic of the optical system describing the method of combining Talbot intensity profile with the diffraction pattern of the grating.

FIG. 7 shows a schematic of an embodiment of an optical system 700 for fabricating microstructures on a substrate.

In this embodiment, the optical system comprises a light source 700. The light source 700 may be or have the characteristics of the light source 73 described herein. A beam collimator comprising lenses 702 and 703 is used to produce collimated beam of light. In other embodiments, the beam collimator is omitted or different optical components are used to create a required beam profile. The light beam is directed to illuminate a diffraction grating 705, producing a diffraction pattern that includes Talbot images. In this embodiment, the operating distance D is $2Z_T$. In this embodiment the grating spacing d is equal to the spacing a of the intensity profile peaks and hence the desired spacing of the microstructure pattern on the substrate is equal to the separation distance d of the slits in the diffraction grating 705.

In other embodiments, optical parameters can be chosen in a manner such that D is any of the intervals $½Z_T$, $3/2Z_T$, $5/2Z_T$, $7/2Z_T$ . . . so on. In still other embodiments, optical parameters can be chosen in a manner such that D is any of the intervals $¼Z_T$, $¾Z_T$, $5/4Z_T$, $7/4Z_T$ . . . so on. Selecting different fractional distances influences the relative spacing of the light intensity profile peaks relative to the grating spacing.

In some embodiments, the optical system includes more than one diffraction grating for printing microstructures patterns on a substrate. The diffraction gratings can be offset from one another so as to create microstructure patterns that are interleaved. For example, embodiments of the optical system include two gratings each of line spacing "d", offset by d/2. In combination the two gratings produce microstructures at a spacing of a=d/2. Therefore, the slit separation of each of the two gratings has double the required microstructure spacing.

In some embodiments the photomask or masks (e.g. the diffraction grating 21 or gratings) are all static. In other embodiments one or more of the diffraction gratings are dynamic. For example, a dynamic grating may be configurable between one configuration with a first line spacing and another configuration with another (i.e. different) line spacing to produce two (or more) different photocuring images. For example, a Digital Micromirror Device (DMD) may be configured so that the micro-mirrors direct light onto the substrate in one state (these micro-mirrors forming the equivalent of slits of a grating, so are called herein "slit state") and not direct light onto the substrate in another state (these forming the equivalent of the substrate between slits of a grating, so are called herein "substrate state"). To transition between images, one or more micro-mirrors forming in the slit state, typically all or substantially all micro-mirrors forming a slit, are switched to the substrate state and/or one or more micro-mirrors forming in the substrate state, typically all or substantially all micro-mirrors forming a substrate between two slits, are switched to the slit state.

In some embodiments two or more images produced by a dynamic photomask each produce on the photocurable material a Talbot image. The method may therefore further include producing different images of light pattern (e.g. Talbot images) using the dynamic photomask and applying the different images to the same photocurable material to cure the material. The dynamic photomask may switch between different Talbot images during the application process, with the images being maintained or substantially maintained for a duration sufficient to effect curing of the photocurable material and any other transitional images not being maintained for a duration sufficient to effect curing the photocurable material. In some embodiments there are three or more different images that the dynamic photomask transitions between. In some embodiments the dynamic photomask is maintained at a fixed or substantially fixed distance from the photocurable material whilst the two or more images are applied.

The Talbot Length and the depth of focus of the Talbot images increase with an increase in the grating period d. Specifically, it is understood $Z_T=2d^2/\lambda$, focal depth increases with the square of the slit spacing, therefore, a small increase in d provides a large increase in focal depth. Therefore, doubling the grating period correspondingly increases the Talbot length $Z_T$ and depth of focus. Accordingly using two offset gratings can result in certain advantages for micropatterning. For example, using offset gratings can facilitate embodiments with reduced complexity, increased tolerance to positioning errors, increased tolerance to uneven/non-planer substrates, increased tolerance to shaking/movements and/or facilitates more cost effective light sources, and enables micropatterning in a less controlled operating environment, for example without the need of an expensive cleanroom environment. Although, the above example particularly describes the use of two diffraction gratings to obtain an increased Talbot length and depth of focus of the Talbot images (in comparison to a like system using one diffraction grating), it would be appreciated that three or more diffraction gratings may be used to further enhance the Talbot length and the depth of focus of the Talbot images.

Figure 8:
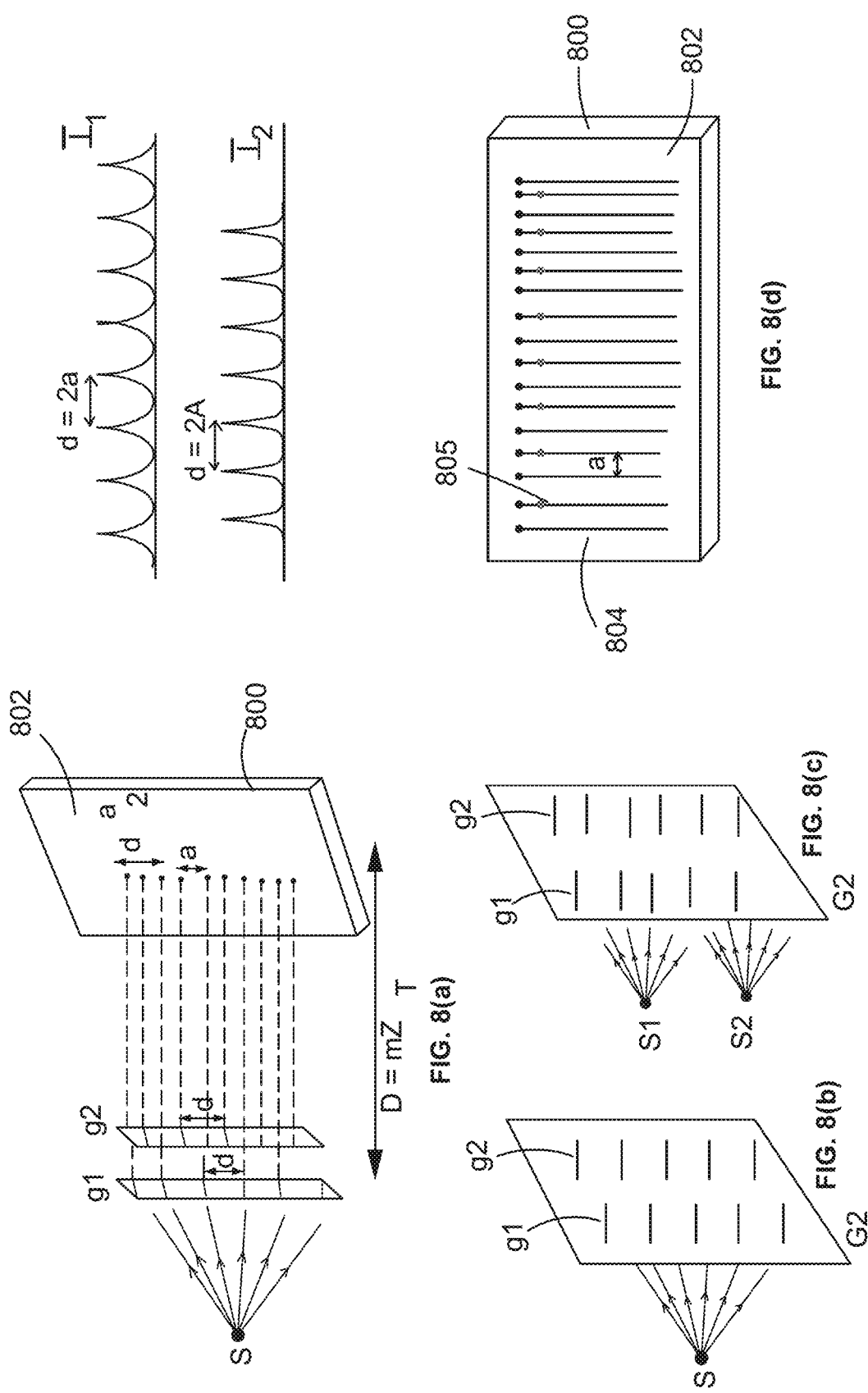
FIGS. 8 (a)-(c) illustrate the use of two diffraction gratings for printing microstructure pattern of desired spacing.

FIGS. 8 (a)-(c) illustrate the use of two diffraction gratings for printing microstructure pattern of desired spacing. Referring to FIG. 8(a) there is shown a single light source illuminating two gratings g1 and g2. Each of these two gratings has a line spacing of "d" and are situated in the same plane and at a distance "D=2$Z_T$" from the photocurable material of the substrate 80. Having two gratings in which at least one is movable relative to the other provides an additional controllable variable, usable to influence the formation of microstructures.

FIG. 8(b) illustrates an embodiment where two gratings g1 and g2 are formed on the same grating substrate G and both the gratings are illuminated using a single light source. Such embodiments may help ensure that the two gratings are displaced by half the slit-grating, to ensure a regular pattern of microstructures.

FIG. 8(c) illustrates an embodiment in which two separate light sources S1 and S2 are used for illuminating gratings g1 and g2, respectively. Because two separate light sources S1 and S2 can be used, each one can utilise relatively low power and inexpensive light sources. Each can also be independently controlled and/or the optics between the light source and the diffraction grating varied and/or controlled, to influence the formation of microstructures.

FIG. 8(d) shows combined intensity profiles $I_1$ and $I_2$ produced by gratings $g_1$ and $g_2$, respectively of any one of FIGS. 8(a)-(c). A layer of photocurable material 802 is on the substrate 800. The photocurable layer 802 is continuously exposed to the intensity patterns $I_1$ and $I_2$ while the substrate traverses orthogonal to the gratings. Microstructures 804 are thus formed within the photocurable material 802. The spacing between the adjacent microstructure is a=d/2. As described herein, the microstructures may be exposed by, for example, removing the non-irradiated portions of the photocurable layer by developing and rinsing. In some embodiments, the step of removing the non-irradiated portions of the photocurable layer is not performed. In some embodiments further curing light or radiation may be used which may comprise substantially uniform radiation across the remaining exposed and or unexposed photocurable material.

The above method allows the use of two gratings, 5 each of which has a line spacing that is twice the desired microstructure spacing (i.e. d=2a). For example, exposure dots 805 created by one grating are diagrammatically shown in FIG. 8(d). This provides significant increases in depth of focus (specifically, a quadruple increase in depth of focus as depth of focus is directly proportional to d2) that allows practical printing of 10 microstructures, for example in non-cleanroom contexts and/or on non-flat surfaces e.g. directly onto an aircraft, conveyor manufacturing plants, roll-to-roll printing systems etc.

In other embodiments, the two gratings may have different slit separation, enabling non-uniform patterns. Further, the gratings need not be offset by half the slit separation with a corresponding change in the distribution of the intensity peaks. In other embodiments three or more gratings may be offset from each other, each grating having the same profile or with one or more of the gratings having a different profile from the others.

Figure 12A:
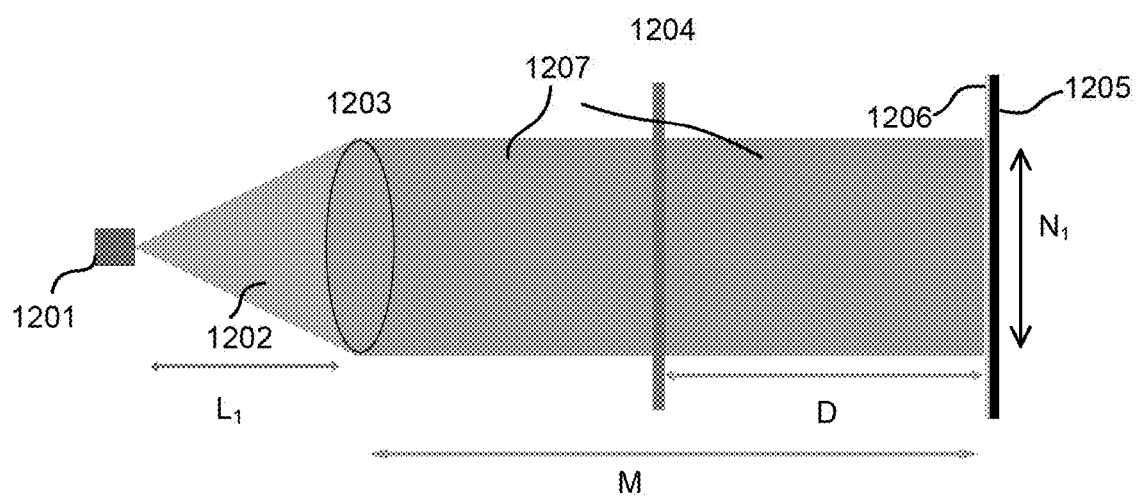
FIGS. 12(a)-(c) show a system for controlling the Talbot image size and/or Talbot image focus.
Figure 12B:
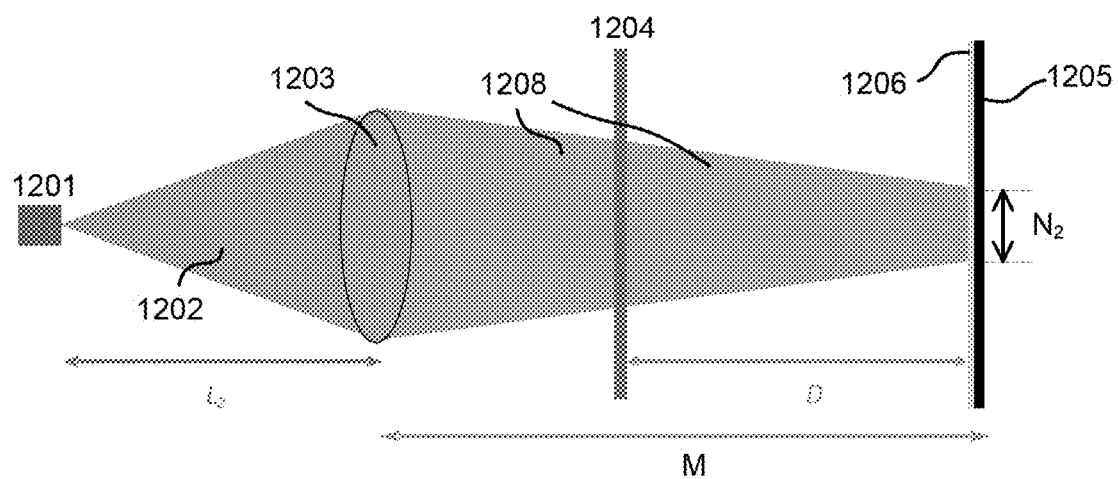
Figure 12C:
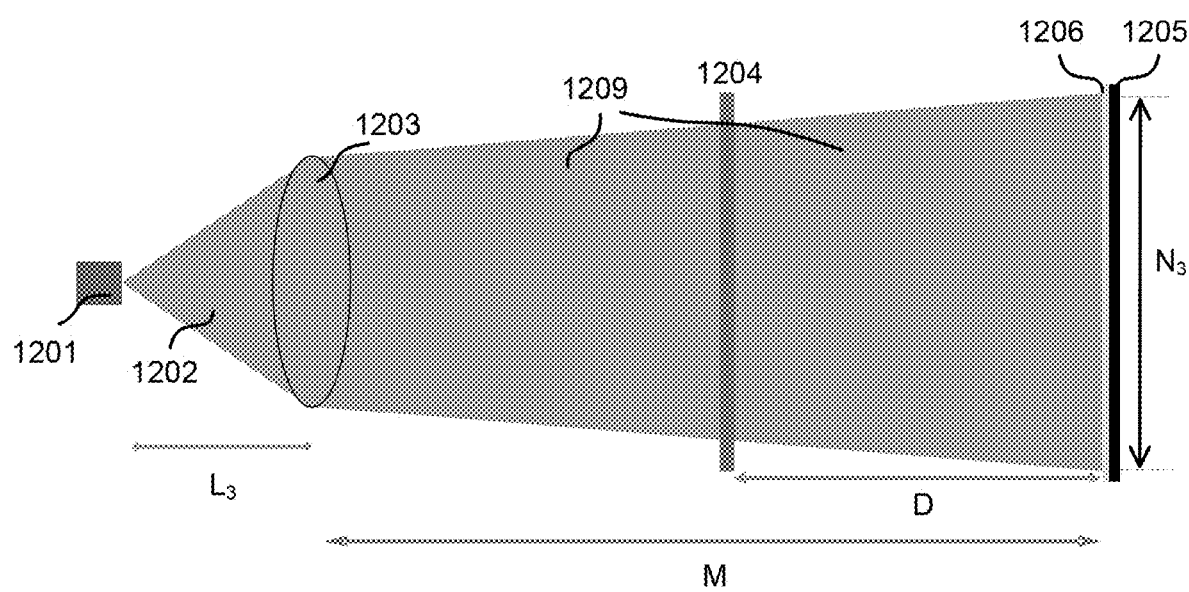

The system of FIGS. 12(a)-(c) may be used with the embodiments described in the present disclosure for controlling the Talbot image size and Talbot image focus. The Talbot image size and Talbot image focus may be controlled independently.

FIGS. 12(a)-(c) show an optical source 1201 emitting an optical field 1202. A convex lens 1203 is used to modify the shape of the optical field. In an alternative embodiment, a concave lens or a combination of various lenses (not shown in FIGS. 12 (a)-(c)) may be used to modify the shape of the optical field. A photomask 1204 (e.g. a diffraction grating) is exposed to the modified optical field 1207 to produce an optical pattern (e.g. a Talbot image). A substrate 1205 comprises a photocurable layer 1206 which is exposed to the optical pattern produced by the photomask 1204. The photocurable layer is placed at a distance D from the photomask 1204 and M from the axis of the lens 1203. The exposure of the optical pattern on the photocurable layer creates microstructures in the photocurable layer 1206. As evident from FIG. 12(a), the optical field 1207 is collimated, thereby producing an optical pattern of size N1. In FIG. 12(b), the optical field 1208 is converging, thereby producing an optical pattern of relatively smaller size N2. In FIG. 12(c), the optical field 1209 is diverging, thereby producing an optical pattern of relatively large size N3.

The system of FIGS. 12(a)-(c) provides an independent control over each of the Talbot image size (N1/N2/N3) and Talbot image focus. The Talbot image size can be adjusted by (a) changing the position of the lens 1203 relative to the optical source 1201 (i.e. by varying L1/L2/L3), and (b) by changing the position of the photocurable layer 1206 relative to the lens 1203 (i.e. by varying M). The Talbot image focus can be adjusted by varying the distance D between the photocurable layer 1206 and photomask 1204.

Figure 13A:
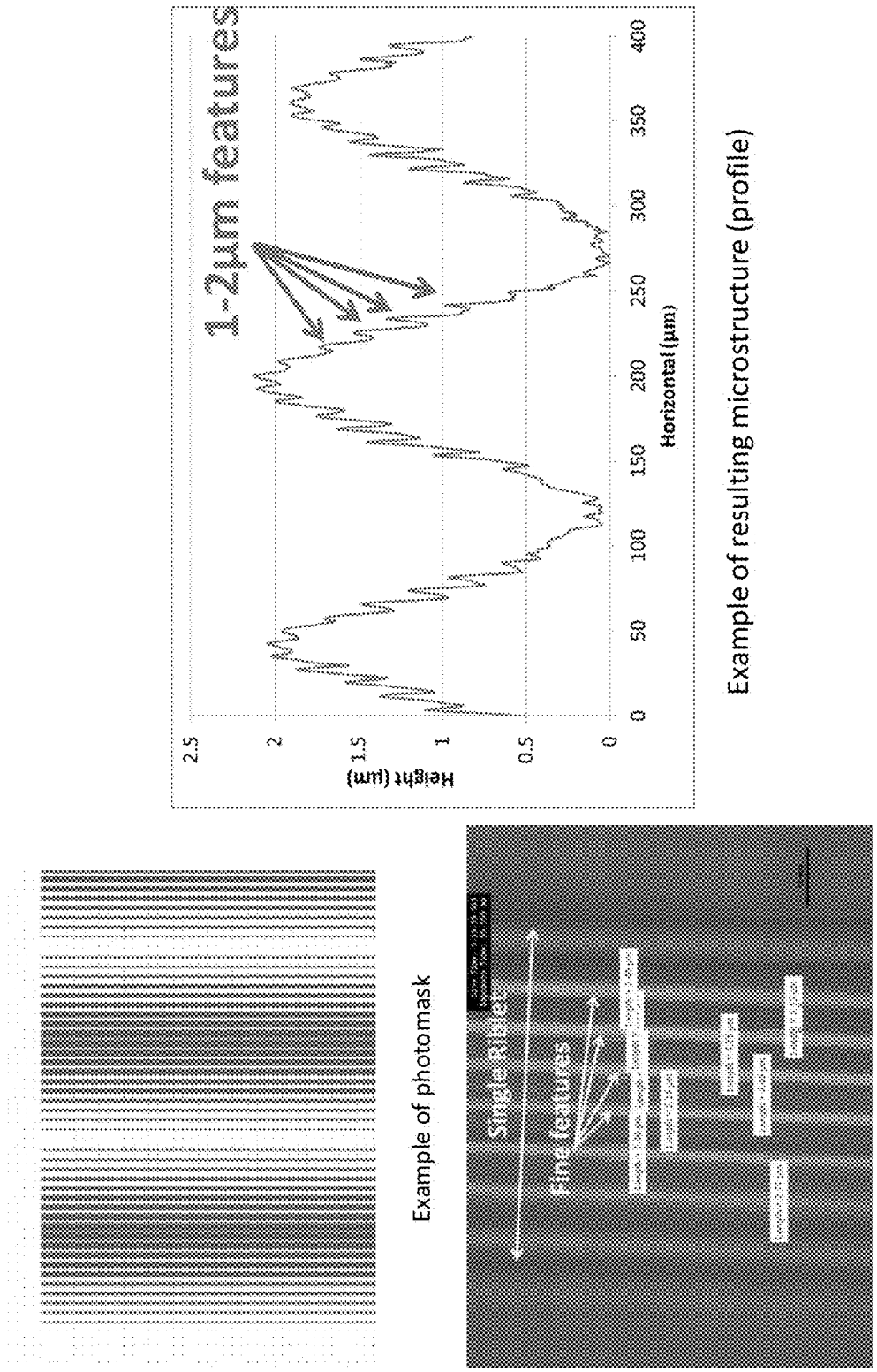

In some embodiments, one or more gratings with a periodic or quasi-periodic pattern (1- and 2-dimensional) may be used. FIGS. 13(*a*)-(*d*) show different periodic and quasi-periodic pattern examples. FIG. 13(*a*) shows in the top left an example photomask with differing slit sizes. In particular, the largest width slits are periodically placed along the grating and between these are a number of smaller slits. The smaller slits create higher frequency variations in the light intensity, which translate to fine features on the microstructures (see bottom left and right in FIG. 13(*a*)). These may be referred to as "lotus leaf"-like structures. Such structures may, for example and without limitation, find application to creating superhydrophobicity.

FIG. 13(*b*) shows an example of a 2-dimensional grating and corresponding intensity profile (left) and an example of microstructures formed using the grating, observed using optical microscopy (right). The structures may, for example and without limitation, find application to creating surfaces with antibacterial properties.

FIG. 13(*c*) shows another example of a 2-dimensional intensity profile (left) and an example of microstructures formed using the grating, observed using optical microscopy (right). The structures may, for example and without limitation, find application to creating surfaces with anti-fouling properties.

FIG. 13(*d*) shows further examples of quasi-periodic photomask intensity profiles for micropatterning, resulting from the Talbot effect.

Embodiments of the present disclosure involve selecting a light source and/or controlling a selected light source or other variables in the optical system to achieve a particular microstructure shape or pattern and/or to achieve variation in the microstructure shape and/or pattern over the substrate. Variables that affect the microstructure shape or pattern include the wavelength(s), wavelength distribution(s), whether the light is converging, diverging or collimated, the angle of incidence of the light with respect to the grating, the relative angles of the grating, and the substrate surface and the intensity of the light. Control of the light source may be by a suitable controller, for example a programmed computer, microcontroller or appropriate hardware.

Therefore, the above described combined intensity profiles can be achieved with non-collimated, cheap laser diodes suitable for printing microstructures. This significantly reduces the complexity and cost of the optical system for producing desired microstructures on a substrate. This does not only enable cheaper, simpler optical systems but it allows us to use convergent or divergent beams to illuminate the mask, thereby reducing or magnifying the irradiance profile coming out of the mask/grating. This allows for making adjustments of the irradiance profiles with a single mask/diffraction grating. This can also be done with active optics (e.g. lenses)—thereby allowing to live-adjust the microstructure patterns as they are printed.

The incoming light beam may be collimated, converging, or diverging. A converging or diverging light beam can be used to manipulate the shape and spacing of the microstructures.

Figure 9:
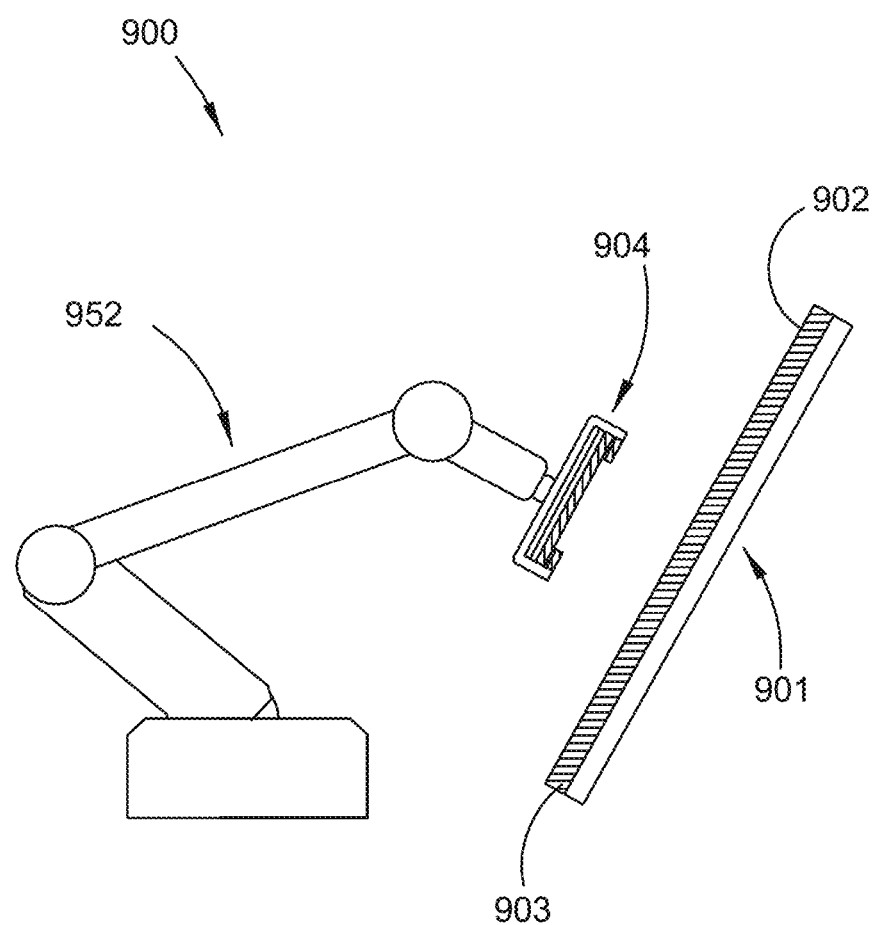
FIG. 9 shows a system which can be used for fabricating microstructure patterns on the exterior surface an aircraft, boat or vehicle using the optical system of the present application.

In some embodiments, a portable microfabrication applicator is provided for fabricating microstructures directly onto a surface in situ. FIG. 9 shows an example portable microfabrication applicator 900 which can be used for micropatterning the exterior surface 902 (e.g. an exterior surface of an aircraft, boat or vehicle) using an optical system 904. Such a portable system will provide an easy, inexpensive and less-laborious procedure of fabricating microstructures for different applications. For example: 1. for fabricating drag-reducing riblet microstructures on an aircraft to improve fuel efficiency; 2. for fabricating drag-reducing riblet microstructures on wind turbine blades to improve output power efficiency; 3. for fabricating anti-fouling and/or drag reducing microstructures on the hull of ships to prevent fouling and/or for reducing drag; 4. for fabricating self-cleaning hydrophobic or antibacterial microstructures flooring or other surfaces to maintain hygiene and cleanliness; and 5. for fabricating matte and soft-touch microstructures for wood furniture and other aesthetic applications.

In some embodiments, the methods and systems of the present disclosure are used for exposure-only microfabrication without carrying out the step of removing the non-radiated portions of the photocurable layer. The resulting microstructures are formed within the UV cured coating. To make such microstructures, a high contrast, high peak irradiance pattern is produced, for example using the optical system described herein with reference to FIGS. 2-9. The high contrast, high peak irradiance pattern is irradiated onto a UV curable layer of a substrate for curing the UV curable layer. After this, lower intensity UV is applied to the photocurable material to further cure the UV curable layer. The lower intensity UV may be substantially uniformly applied, for example using a UV lamp. This process produces differences in refractive index, therefore the resulting microstructures are visible but are substantially under the top surface of the UV curable layer. This process can produce different optical effects including reduced reflectivity (for example a matte finish on a surface) and different diffractive effects. In some embodiments, this process may also produce small protrusions of the resulting microstructures from the top surface of the UV curable layer. For example, typical protrusions of less than 2 microns may be observed. Therefore, low aspect ratio microstructures can be made using this process in which the step of removing the non-radiated portions of the photocurable material is not performed.

Furthermore, embodiments of the present disclosure also provide applications in the packaging industry. UV curable coatings are already used in the packaging industry. At least some embodiments of the present disclosure can be used for fabricating microstructures in the UV curable coating in the packaging. The microstructure fabrication in the UV curable coating of the packages has many advantages and applications, for example: 1. for imparting diffractive or holographic optical effects as a security feature within the UV curable coating of the package; 2. for imparting antibacterial properties; and 3. for imparting matter or soft-touch finish properties.

In some embodiments, a microfabrication integration unit can be used to integrate into production lines that utilise UV curable coatings for micropatterning surfaces on such products. Such a microfabrication integration unit can leverage existing UV coating and curing infrastructure to for an easy, inexpensive method for fabricating microstructures for different applications. For example: 1. for fabricating matte or soft-touch or anti-bacterial surfaces in wood processing lines 2. for optical or anti-bacterial surfaces in food packaging lines; 3. for superhydrophobic or anti-fouling surfaces in graphic arts printing.

Embodiments of the present disclosures may also provide applications in 3D printing industry. For example, microstructures can be fabricated onto surfaces of 3D printed objects printed out of a UV curable material. Typically, after a DLP or SLA 3D printer prints an object, it undergoes a final UV post-cure or washing off of uncured resin in solvent before achieving final material properties. Embodiments of the present disclosure can be used to fabricate microstructures on the 3D printed object for imparting functional microstructure properties onto the surface of the printed object after the 3D print and before the final UV post-cure or washing off of uncured resin in solvent.

Moreover, as a continuous and contactless method, with large depth of focus, and low cost components that can be run in parallel, the process is scalable to large substrates allowing reductions in time and cost of application.

Figure 10A:
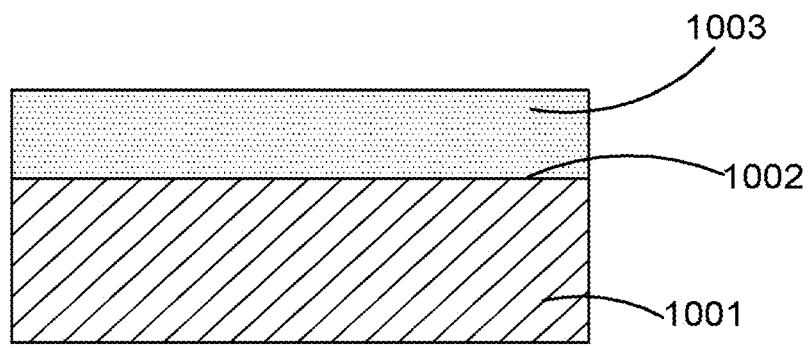
FIGS. 10(a) and 10(b) illustrate oxygen inhibition and its effect on the process of microstructure fabrication.
Figure 10B:
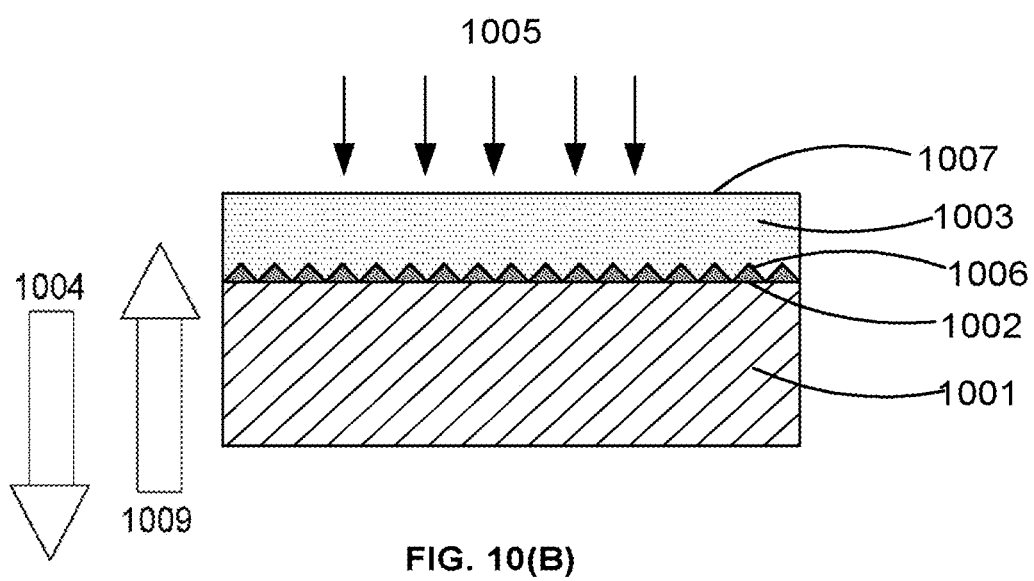

FIGS. 10(a) and 10(b) illustrate the process of microstructure fabrication in which the photocurable layer is directly exposed to the optical field through is upper surface that is in contact with air. FIG. 10(a) shows a substrate 1001 with a layer of photocurable material 1003 on its first surface 1002. Direction 1004 is the direction of exposure of optical field to the photocurable layer 1003. In some embodiments the process works by bottom-up-curing, in which curing of the photopolymer is in the opposite direction 1009. FIG. 10(b) shows the fabrication of microstructures 1006 when the upper surface 1007 of the photocurable material is irradiated by an optical profile 1005. The optical field 1005 has an intensity sufficient so that curing light reach the bottom of the photocurable layer 1003 and causes it to cure and adhere. As some portion of the optical filed intensity has been depleted due to the light traversing through the photocurable layer 1003 to reach the first surface 1002 to initiate bottom-up-curing of the photocurable material, the height of the resulting microstructures is limited. Accordingly, in general, when taller microstructures are desired, a higher intensity of the optical field is needed.

Other embodiments of the present disclosure fabricate microstructures or microstructure patterns based on irradiating a photocurable material through a transparent or semitransparent substrate, such that curing commences on the side of the photocurable material facing the light source. This approach may help ensure adhesion of the cured photocurable material to the substrate. The approach may also facilitate taller microstructures relative to the approach of FIG. 10(a) for a given light intensity.

Figure 11A:
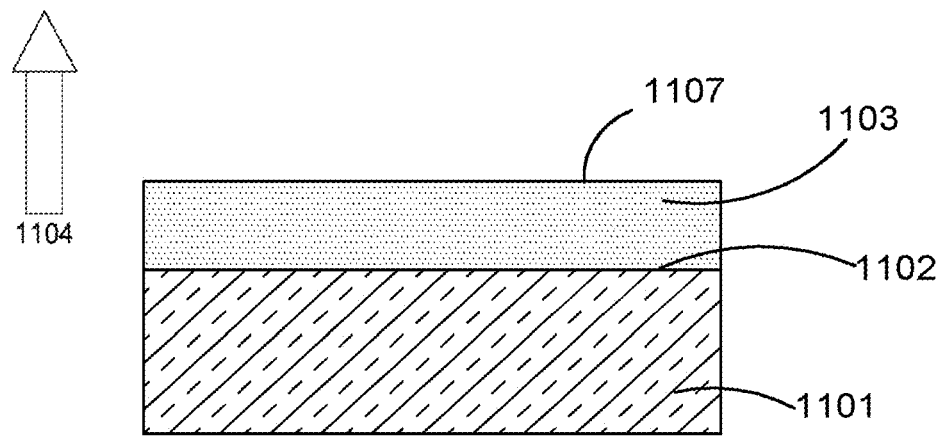
FIGS. 11(a) and 11(b) illustrate a method and system for microfabrication on a transparent substrate, such that the direction of exposure and curing direction are the same.
Figure 11B:
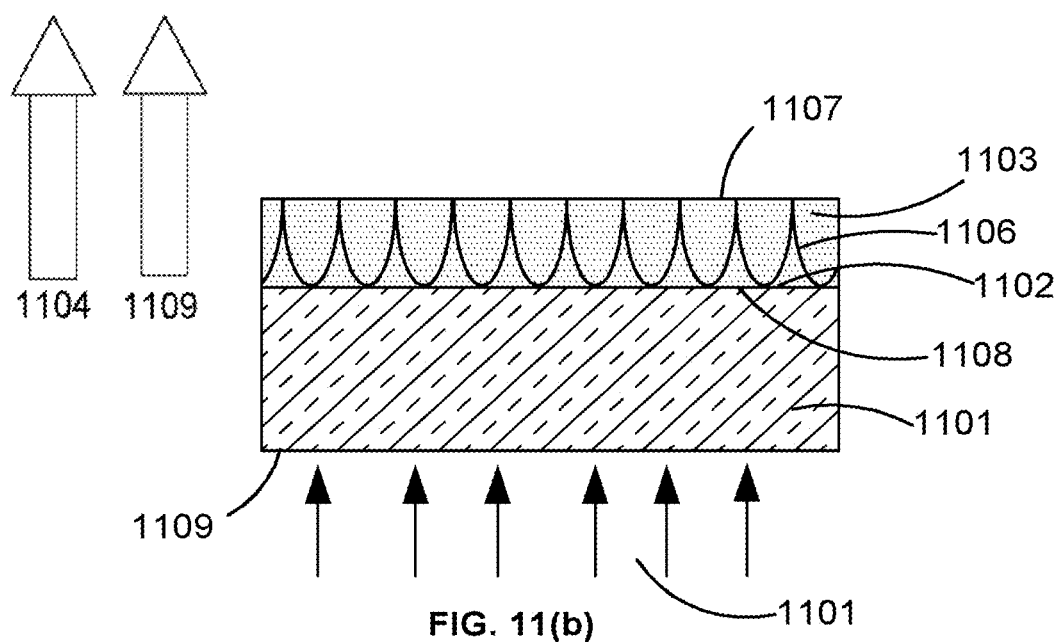

FIG. 11(a) shows a transparent substrate 1101. The transparency of the substrate is determined with reference to the curing light and the substrate is transparent for the curing light when an effective amount of light traverses the substrate to cure the photocurable material. In an embodiment, the substrate is a transparent glass substrate. In another embodiment, the substrate may be a transparent plastic substrate. A layer of a photocurable material 1103 is applied or is present on a first surface 1102 of the transparent substrate. An optical profile 1101 is irradiated onto a second surface 1109 of the transparent substrate. In this way, the photocurable layer is exposed to the optical profile through the transparent substrate from underneath i.e. from its bottom surface 1108 rather than from its top surface 1107.

In certain embodiments, the optical profile exposed from beneath the transparent substrate is produced using a diffraction grating in the same or a similar manner as already described herein.

One of the potential applications of the method of curing from beneath the transparent substrate may be in a roll-to-roll type production line where microstructures will be fabricated on flexible transparent substrates e.g. transparent plastic substrates/sheets/films. This will enable high throughput printing of microstructured substrates/sheets/films. The transparent plastic substrates/sheets/films may be adhesive-backed for application on numerous surfaces once the microstructures have been fabricated on them. For example: 1. drag reducing riblet films may be made to improve efficiency or speed for competitive sport applications including, air, land and water sports; 2. antibacterial microstructure films may be used in hospitals, aircraft, public transport or other high-touch surface application to reduce risk of spread of infection; and 3. anti-reflective or radiation absorbing films may be used to reduce glare or increase transmission efficiency.

Other benefits of one or more of the above described embodiments of the present disclosure include: 1. By being a contactless microfabrication method, it enables the fabrication of high aspect ratio microstructures e.g. tall thin "blade" type riblets that have greater drag reduction performance, up to double that of sawtooth-shaped riblet designs, but are difficult or impossible to fabricate with alternative contact fabrication methods such as nanoimprint lithography; 2. It allows high throughput fabrication limited only by the photopolymerisation which occurs at a timescale of a fraction of a second; 3.

Microstructure design changes can be made with adjustments to the intensity curing profile, as discussed above this can be manipulated with diverging or converging light beams to adjust magnification, or by adjusting laser power output in time. This allows for low cost, fast and even real-time adjustments to microstructure designs during fabrication as compared to alternative methods e.g. nanoimprint lithography which require expensive imprint masks to be fabricated for any design change; 4. As it is a contactless method, the photomask/diffraction grating does not get damaged during fabrication and is a simple 2D pattern that is relatively low cost, for example as compared to some methods in nanoimprint lithography which are susceptible to damage during imprinting and have specialised 3D designs made across a large imprinting stamp; 5. Being a contactless method allows microfabrication with pre-existing UV curable coatings already used in industry with minimal or no change to the formulation required. For example, printing matte microstructures out of existing UV-curable wood coatings or riblet drag-reducing microstructures out of aerospace or automotive coatings. This is compared to alternative contact methods such as those in nanoimprint lithography whereby the coating needs to be formulated so that it interacts correctly with the imprinting mask sufficiently to create the microstructure but not so much that microstructures are damaged or remain stuck to the mask itself.

As used herein the terms "include" and "comprise" (and variations of those terms, such as "including", "includes", "comprising", "comprises", "comprised" and the like) are intended to be inclusive and are not intended to exclude further features, components, integers or steps.

It will be understood that the embodiments disclosed and defined in this specification extends to all alternative combinations of two or more of the individual features mentioned or evident from the text or drawings. All of these different combinations constitute various alternative aspects of the embodiments.

What is claimed is:
1. A method for forming microstructures, comprising:
applying, to a photocurable material, at least one image of light or radiation for curing the photocurable material in a pattern corresponding to the image, wherein each image is formed by near-field diffraction of the light or radiation through at least one photomask and comprises areas of higher intensity adjacent to areas of lower intensity; and maintaining or substantially maintaining each image during the applying for a duration sufficient to effect curing of the photocurable material, the curing forming microstructures within the photocurable material;

wherein the at least one image of light or radiation comprises a first image and a second image, and the first and second images are interleaved in which areas of higher intensity of the first image are applied in locations of lower intensity for the second image;

and wherein an operating distance between the at least one photomask and the photocurable material remains substantially constant during the applying step.

2. The method of claim 1, wherein the first image and the second image are each substantially a Talbot image formed at an integer multiple of a quarter of a Talbot length.

3. The method of claim 1, wherein the first image and the second image are each substantially a Talbot image formed at a half or an integer multiple of a half of a Talbot length.

4. The method of claim 1, wherein the first image and the second image are each substantially a Talbot image formed at a full or an integer multiple of a full Talbot length.

5. The method of claim 1, wherein the at least one photomask comprises a dynamic photomask and the first image is applied by a first configuration of dynamic photomask and the second image is applied by a second configuration of the dynamic photomask.

6. The method of claim 1, wherein the light or radiation is non-monochromatic light or multimodal light.

7. The method of claim 1, wherein the at least one photomask comprises a first diffraction grating and a second diffraction grating and wherein said applying at least one image of light or radiation for curing the photocurable material comprises applying the first image by the first diffraction grating and the second image by the second diffraction grating that is offset from the first diffraction grating.

8. The method of claim 7, wherein the first diffraction grating and the second diffraction grating both comprise slits with a first separation distance and wherein the offset is substantially equal to half the first separation distance.

9. The method of claim 1, wherein the method comprises causing the first image and the second image to traverse the photocurable material while maintaining areas of higher intensity of the first image interleaved with areas of higher intensity of the second image.

10. The method of claim 1, wherein each said image has a periodic or quasi-periodic pattern across a first dimension.

11. The method of claim 1, wherein at least the first image has a periodic or quasi-periodic pattern in two dimensions.

12. The method of claim 1, wherein applying the least one image of light or radiation is through a transparent or semi-transparent substrate of the photocurable material.

13. The method of claim 12, wherein the transparent or semi-transparent substrate is from a roll and the method comprises transferring the substrate from the roll to another roll and applying the at least one image of light or radiation at an intermediate point between the two rolls.

14. The method of claim 1, wherein the light is sourced from one or more lasers.

15. The method of claim 1, wherein the microstructures have a height between 0.10 and 250 microns (inclusive).

16. The method of claim 1, wherein the microstructures have a height between 25 and 250 microns (inclusive).

17. The method of claim 1, wherein the microstructures have a height between 0.1 and 5 microns (inclusive).

18. The method of claim 1, comprising leaving the microstructures within the photocurable material.

19. The method of claim 1, comprising at least partially removing photocurable material to expose the microstructures.

20. The method of claim 1, wherein applying the at least one image of light or radiation is by a portable applicator comprising at least one light source for providing the applied light and an optical system for receiving light from the at least one light source and generating the at least one image.

* * * * *